(12) United States Patent
Rios et al.

(10) Patent No.: US 9,685,398 B2
(45) Date of Patent: Jun. 20, 2017

(54) THIN SEMICONDUCTOR DEVICE PACKAGES

(71) Applicant: FAIRCHILD SEMICONDUCTOR CORPORATION, San Jose, CA (US)

(72) Inventors: Margie Rios, Cebu (PH); Aira Lourdes Villamor, Cebu (PH); Maria Cristina Estacio, Lapulapu (PH); Armand Vincent Jereza, Bucheon-si (KR)

(73) Assignee: Fairchild Semiconductor Corporation, Sunnyvale, CA (US)

(*) Notice: Subject to any disclaimer, the term of this patent is extended or adjusted under 35 U.S.C. 154(b) by 0 days.

(21) Appl. No.: 15/082,660

(22) Filed: Mar. 28, 2016

(65) Prior Publication Data

US 2016/0284628 A1 Sep. 29, 2016

Related U.S. Application Data

(60) Provisional application No. 62/139,398, filed on Mar. 27, 2015.

(51) Int. Cl.
*H01L 23/495* (2006.01)
*H01L 23/31* (2006.01)
(Continued)

(52) U.S. Cl.
CPC .... *H01L 23/49541* (2013.01); *H01L 23/3107* (2013.01); *H01L 23/49548* (2013.01);
(Continued)

(58) Field of Classification Search
CPC . H01L 21/561; H01L 23/3107; H01L 23/492; H01L 23/49524; H01L 23/49562; H01L 23/49568; H01L 23/49805
See application file for complete search history.

(56) References Cited

U.S. PATENT DOCUMENTS

| 8,344,499 B2 | 1/2013 | Gong et al. |
| 2007/0161151 A1* | 7/2007 | Madrid ............... H01L 23/4334 438/106 |

(Continued)

OTHER PUBLICATIONS

"Blade 3X3 Pushing the Boundaries for Discrete 25V/30V Power MOSFETs", Infineon Technologies AG, 2 pages, Mar. 2013.

(Continued)

*Primary Examiner* — Daniel Shook
(74) *Attorney, Agent, or Firm* — Brake Hughes Bellermann LLP

(57) ABSTRACT

In a general aspect, a packaged semiconductor device can include a semiconductor die having at least a first terminal on a first side of the semiconductor die and a second terminal on a second side of the semiconductor die. The device can include a leadframe portion electrically coupled to the first terminal of the semiconductor die and a clip portion electrically coupled to the second terminal of the semiconductor die. The device can include a molding compound. A surface of the leadframe portion and a first surface of the molding compound can define at least a portion of a first surface of the device. A surface of the clip portion and a second surface of the molding compound can define at least a portion of a second surface of the device that is parallel to the first surface of the device.

21 Claims, 13 Drawing Sheets

(51) Int. Cl.
*H01L 21/56* (2006.01)
*H01L 21/48* (2006.01)
(52) U.S. Cl.
CPC ........ *H01L 21/4839* (2013.01); *H01L 21/561* (2013.01); *H01L 23/49562* (2013.01); *H01L 23/49568* (2013.01)

(56) References Cited

U.S. PATENT DOCUMENTS

2010/0176508 A1* 7/2010 Herbsommer ...... H01L 23/4334
257/718
2015/0162270 A1 6/2015 Ashrafzadeh et al.

OTHER PUBLICATIONS

"Silicon N-channel MOSFET for Load-switching", Panasonic, 8 pages, Oct. 25, 2012.

* cited by examiner

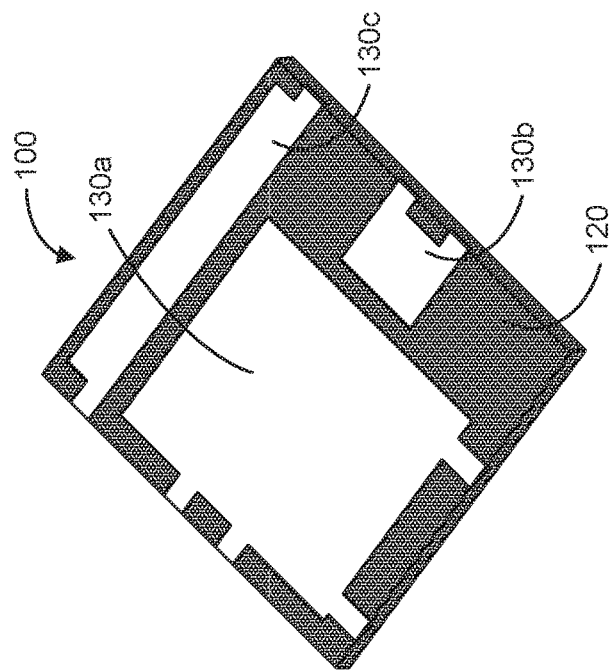
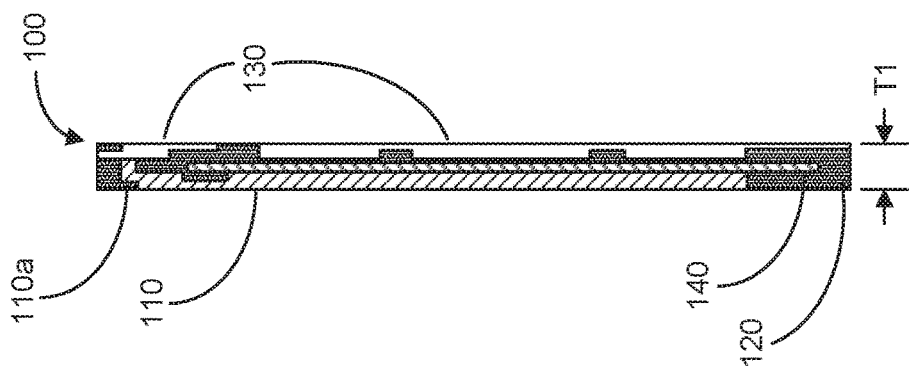
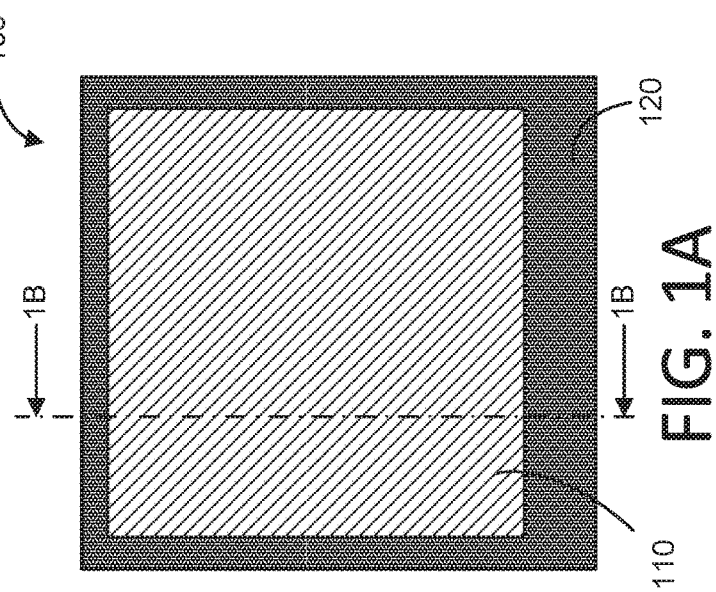
FIG. 1C
FIG. 1B
FIG. 1A

THIN SEMICONDUCTOR DEVICE PACKAGES

CROSS REFERENCE TO RELATED APPLICATIONS

This application claims priority to and the benefit of U.S. Provisional Application No. 62/139,398, filed Mar. 27, 2015, entitled "THIN SEMICONDUCTOR DEVICE PACKAGE AND METHOD OF MANUFACTURE", which is hereby incorporated by reference in its entirety.

TECHNICAL FIELD

This description relates to packaged semiconductor devices. More specifically, this description relates to thin semiconductor device packages that may be used for semiconductor power devices and to methods of manufacturing such packaged semiconductor devices.

SUMMARY

In a general aspect, a packaged semiconductor device can include a semiconductor die having at least a first terminal on a first side of the semiconductor die and at least a second terminal on a second side of the semiconductor die. The packaged semiconductor device can also include a leadframe portion electrically coupled to the first terminal of the semiconductor die and a clip portion electrically coupled to the second terminal of the semiconductor die. The packaged semiconductor device can also include a molding compound. A surface of the leadframe portion and a first surface of the molding compound can define at least a portion of a first surface of the packaged semiconductor device. A surface of the clip portion and a second surface of the molding compound can define at least a portion of a second surface of the packaged semiconductor device that is parallel to the first surface of the packaged semiconductor device, where the second surface of the packaged semiconductor device is on an opposite side of the packaged semiconductor device from the first surface of the packaged semiconductor device.

Implementations can include one or more of the following features. For example, the leadframe portion can be a first leadframe portion and the packaged semiconductor device further can include a second leadframe portion electrically coupled to a third terminal on the first side of the semiconductor die. The second leadframe portion can have a surface included in the first surface of the packaged semiconductor device. The packaged semiconductor device can include a third leadframe portion electrically coupled with the second terminal of the semiconductor die through the clip portion. The third leadframe portion can have a surface included in the first surface of the packaged semiconductor device.

The clip portion can be a first clip portion and the packaged semiconductor device can include a second clip portion electrically coupled with the first terminal of the semiconductor die via the first leadframe portion. The second clip portion can have a surface included in the second surface of the packaged semiconductor device. The packaged semiconductor device can include a third clip portion electrically coupled with the third terminal of the semiconductor die via the third leadframe portion. The third clip portion can have a surface included in the second surface of the packaged semiconductor device. The packaged semiconductor device can include a first plated portion disposed on the second surface of the packaged semiconductor device, where the first plated portion is electrically coupled with the first clip portion. The packaged semiconductor device can include a second plated portion disposed on the second surface of the packaged semiconductor device, where the second plated portion is electrically coupled with the second clip portion. The packaged semiconductor device can include a third plated portion disposed on the second surface of the packaged semiconductor device, where the third plated portion is electrically coupled with the third clip portion.

The clip portion can be a first clip portion and the packaged semiconductor device can include a second clip portion electrically coupled with the third terminal of the semiconductor die via the second leadframe portion. The second clip portion can have a surface included in the second surface of the packaged semiconductor device.

The first terminal of the semiconductor die can be a source terminal of a field effect transistor (FET) device. The second terminal of the semiconductor die can be a drain terminal of the FET device. The third terminal of the semiconductor die can be a gate terminal of the FET device.

The first terminal of the semiconductor die can be a gate terminal of a field effect transistor (FET) device. The second terminal of the semiconductor die can be a drain terminal of the FET device. The third terminal of the semiconductor die can be a drain terminal of the FET device.

The clip portion can be a first clip portion and the packaged semiconductor device can include a second clip portion electrically coupled with the first terminal of the semiconductor die via the leadframe portion. The second clip portion can have a surface included in the second surface of the packaged semiconductor device.

The packaged semiconductor device can include a laminate layer affixed to the second surface of the packaged semiconductor device. The laminate layer can substantially cover the second surface of the packaged semiconductor device and have an outer surface that is substantially parallel with the second surface of the packaged semiconductor device.

The packaged semiconductor device can include a plated portion disposed on the second surface of the packaged semiconductor device. The plated portion can be electrically coupled with the clip portion. The plated portion can have a surface area on the second surface of the packaged semiconductor device that is different than a surface area of the surface of the clip portion.

The packaged semiconductor device can have a heat slug affixed to the clip portion.

In another general aspect, a packaged semiconductor device can include a semiconductor die having a first terminal on a first side of the semiconductor die, a second terminal on a second side of the semiconductor die and a third terminal on the second side of the die. The packaged semiconductor device can also include a leadframe portion electrically coupled to the first terminal of the semiconductor die and coupled to the first side of the semiconductor die. The packaged semiconductor device can further include a first clip portion electrically coupled to the second terminal of the semiconductor die and coupled to the second side of the semiconductor die. The packaged semiconductor device can still further include a second clip portion electrically coupled to the third terminal of the semiconductor die and coupled to the second side of the semiconductor die. The packaged semiconductor device can also include a third clip portion electrically coupled to the first terminal of the semiconductor die via the leadframe portion. The packaged semiconductor device can also include a molding compound. A surface of the leadframe portion and a first surface of the molding compound can define at least a portion of a first surface of the packaged semiconductor device. A surface of the first clip portion, a surface of the second clip portion, a surface of the third clip portion and a second surface of the molding compound can define at least a portion of a second surface of the packaged semiconductor device. The second surface of the packaged semiconductor device can be parallel to the first surface of the packaged semiconductor device, the second surface of the packaged semiconductor device being on an opposite side of the packaged semiconductor device from the first surface of the packaged semiconductor device.

Implementations can include one or more of the following features. For example, the first terminal of the semiconductor die can be a drain terminal of a field effect transistor (FET) device. The second terminal of the semiconductor die can be a gate terminal of the FET device. The first terminal of the semiconductor die can be a source terminal of the FET device.

The packaged semiconductor device can include a first plated portion disposed on the second surface of the packaged semiconductor device, where the first plated portion is electrically coupled with the first clip portion. The packaged semiconductor device can include a second plated portion disposed on the second surface of the packaged semiconductor device, where the second plated portion is electrically coupled with the second clip portion. The packaged semiconductor device can include a third plated portion disposed on the second surface of the packaged semiconductor device, where the third plated portion is electrically coupled with the third clip portion.

The first plated portion can have a surface area on the second surface of the packaged semiconductor device that is different than a surface area of the surface of the first clip portion. The second plated portion can have a surface area on the second surface of the packaged semiconductor device that is different than a surface area of the surface of the second clip portion. The third plated portion can have a surface area on the second surface of the packaged semiconductor device that is different than a surface area of the surface of the third clip portion.

In another general aspect, a packaged semiconductor device can include a semiconductor die having a first terminal on a first side of the semiconductor die, a second terminal on a second side of the semiconductor die and a third terminal on the second side of the die. The packaged semiconductor device can also include a clip portion electrically coupled to the first terminal of the semiconductor die and coupled to the first side of the semiconductor die. The packaged semiconductor device can further include a first leadframe portion electrically coupled to the second terminal of the semiconductor die and coupled to the second side of the semiconductor die. The packaged semiconductor device can still further include a second leadframe portion electrically coupled to the third terminal of the semiconductor die and coupled to the second side of the semiconductor die. The packaged semiconductor device can also further include a third leadframe portion electrically coupled to the first terminal of the semiconductor die via the clip portion. The packaged semiconductor device can also include a molding compound. A surface of the clip portion and a first surface of the molding compound can define at least a portion of a first surface of the packaged semiconductor device. A surface of the first leadframe portion, a surface of the second leadframe portion, a surface of the third leadframe portion and a second surface of the molding compound can define at least a portion of a second surface of the packaged semiconductor device. The second surface of the packaged semiconductor device can be parallel to the first surface of the packaged semiconductor device. The second surface of the packaged semiconductor device can be on an opposite side of the packaged semiconductor device from the first surface of the packaged semiconductor device.

Implementations can include one or more of the following features. For example, the first terminal of the semiconductor die can be a drain terminal of a field effect transistor (FET) device. The second terminal of the semiconductor die can be a gate terminal of the FET device. The third terminal of the semiconductor die can be a source terminal of the FET device.

The packaged semiconductor device can include a plated portion disposed on the first surface of the packaged semiconductor device. The plated portion can be electrically coupled with the clip portion. The plated portion can have a surface area on the first surface of the packaged semiconductor device that is different than a surface area of the surface of the clip portion.

BRIEF DESCRIPTION OF THE DRAWINGS

FIG. 1A is a diagram illustrating a top-side view of a packaged semiconductor device, according to an implementation.

FIG. 1B is a diagram illustrating a side, cross-sectional view of the packaged semiconductor device of FIG. 1A.

FIG. 1C is a diagram illustrating a bottom-side view of the packaged semiconductor device of FIG. 1A.

Figure 2:
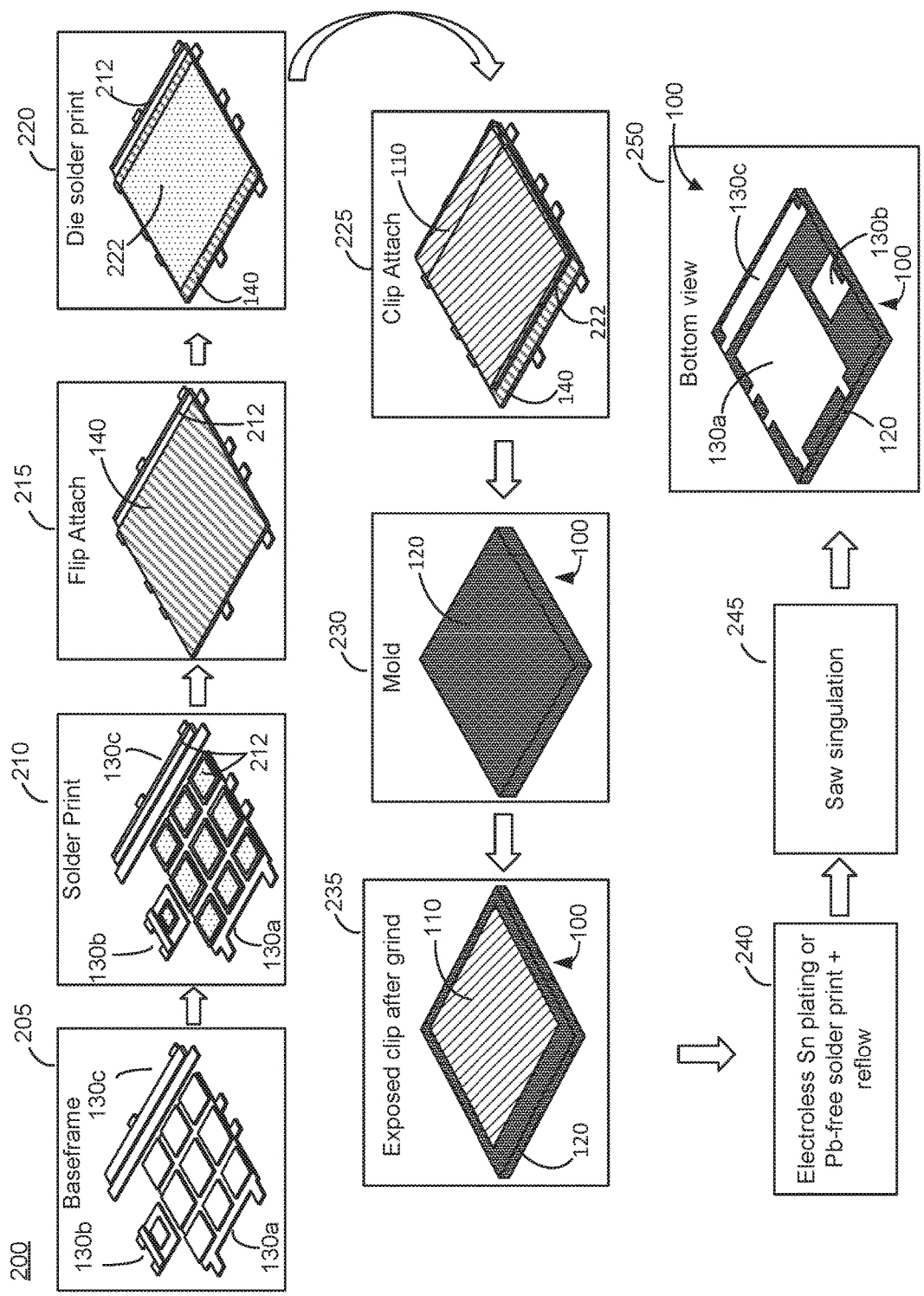
FIG. 2 is a flow diagram illustrating a manufacturing process that can be used to produce the packaged semiconductor device illustrated in FIGS. 1A-IC, according to an implementation.

In the drawings, like reference symbols in the various drawings indicate like elements. Reference numbers for some like elements may not be repeated for all such elements. In certain instance, different reference numbers may be used for like elements, or similar elements. Some reference numbers for certain elements of a given implementation may not be repeated in each drawing corresponding with that implementation. Some reference numbers for certain elements of a given implementation may be repeated in other drawings corresponding with that implementation, but may not be specially discussed with reference to each corresponding drawing.

DETAILED DESCRIPTION

This disclosure relates to various packaged semiconductor device apparatuses and associated methods for manufacturing such packaged semiconductor devices. The approaches illustrated and described herein can be used to package any number of different semiconductor devices. However, for purposes of illustration and clarity, the embodiments illustrated and described herein will be discussed with respect to packaged semiconductor devices (and associated manufacturing methods) that include a vertical power metal-oxide semiconductor field-effect transistor (MOSFET), such as a planar vertical power MOSFET, or a trench gate vertical power MOSFET (collectively hereafter "vertical FETs") implemented on a semiconductor die.

For the example implementations described herein, a semiconductor die used to implement such a vertical FET can be referred to as having a top-side surface (top surface, upper surface, and so forth) and a back-side surface (bottom surface, lower surface, and so forth). Further, for the example implementations described herein, such vertical FETs can be referred to as having a back-side drain contact or drain terminal (e.g., on a back-side of a semiconductor die), a top-side gate terminal and a top-side source terminal (e.g., on a top-side of the semiconductor die). Again, vertical FET devices are described herein only by way of example and for purposes of illustration. The semiconductor device packages and corresponding manufacturing flows illustrated and described herein can be used in conjunction with any number of different types of semiconductor devices, such as other power semiconductor devices, application-specific semiconductor devices, etc.

The semiconductor device packages and corresponding manufacturing flows described herein may have certain advantages over one or more current semiconductor device package implementations and their associated manufacturing flows. For example, the approaches described herein can allow for producing extremely thin packaged semiconductor devices, such as packaged semiconductor devices that have an overall thickness of less than or equal to approximately 310 µm. In other implementations, such packaged semiconductor devices can have an overall thickness of less than or equal to approximately 285 µm. In still other implementations, a packaged semiconductor device can include a laminate (e.g., with a thickness of approximately 50 µm) and can have an overall thickness, including the laminate layer, of less than or equal to approximately 275 µm. Further, the approaches described herein can allow for producing packaged semiconductor devices where an overall size (e.g., area of the top and bottom sides or surfaces) of a packaged semiconductor device (e.g., an area the packaged device consumes on a circuit board) is less than 1.25 times a die size (footprint or surface area) of the associated semiconductor die included in the packaged device.

Still further, the approaches described herein can allow for producing packaged semiconductor devices where a corresponding semiconductor die is fully encapsulated in the semiconductor device package, rather than having a bottom-side surface (e.g., drain side contact or terminal) of the semiconductor die exposed through a molding compound, such as a thermoset plastic, or other appropriate molding compound. Such implementations, as compared to implementations were at least a portion of a corresponding semiconductor die is exposed) can prevent damage to the semiconductor die due to exposure to external conditions (e.g., possible physical damage, moisture, etc.)

Implementations of packaged semiconductor devices illustrated and described herein can include low-impedance (e.g., low resistance and/or low inductance) gate, drain and source contacts that are implemented as thick copper conductor lines (e.g., included in one or more leadframe portions and/or one or more clip portions) that contact (electrically and/or physically contact) with terminals (e.g. pads, bond pads, etc.) of a semiconductor die and with respective plated copper (Cu) pads. Such plated Cu pads can define final exposed pads (e.g., gate, source and drain contact pads) of an associated packaged semiconductor device. Those exposed pads can be implemented so as to be compatible with a layout of a circuit board on which they are included (e.g. flexible pad layout) and also to increase contact size of the packaged semiconductor device with an associated circuit board (e.g., to reduce impedance and/or improve solder joint reliability). In implementations, the clip portion can be attached to an opposite side of a semiconductor die as a leadframe (or baseframe), where the clip provides electrical connections to the die, the leadframe (baseframe) and also external electrical contacts. In manufacturing process flows, a clip can be used in place of other electrical interconnect methods, such as wire bonding, and so forth.

The semiconductor device packages and associated methods of manufacture described herein can provide for producing very thin power semiconductor device packages with small form factors (e.g., circuit board footprints) that have very low thermal resistance and very low contact impedance (e.g., resistance and/or inductance). Accordingly, such semiconductor device packages may be well adapted for use in mobile electronics applications, such as smartphones, wearable electronics, and so forth. The disclosed semiconductor device packages can provide for both top-side and bottom-side cooling (e.g., thermal energy dissipation in a very thin, e.g., less than 310 µm thick, device package).

As noted above, embodiments of semiconductor device packages and associated methods of manufacture described herein can provide for flexibility of exposed pad layouts (e.g., external electrical contacts layout) so as to be allow for compatibility with specific layout configurations (e.g., circuit board requirements). The approaches described herein can provide for implementing single die or multi-die packaged semiconductor devices (e.g., a single or multiple semiconductor die in a single package). Further, the semiconductor device packages and associated methods of manufacture described herein can provide for accommodating reduced package size to die size ratios (e.g., less than 1.25), and can, therefore, provide for lower on-resistance devices (e.g., MOSFETS with larger channel widths) to be included in packages with smaller footprints (area) than current implementations.

Various methods for manufacturing packaged semiconductor devices are described herein. The manufacturing methods described herein include manufacturing process flows that include pre-assembling singulated semiconductor dice on leadframes, which can also be referred to as baseframes, (e.g., in strip or matrix form on an adhesive tape) and attaching clips to the semiconductor dice. The pre-assembled dice (e.g., respective die, leadframe and clip assemblies) can then be singulated and picked-and-placed (e.g., after a UV cure to facilitate removal from the adhesive tape) onto an adhesive panel or adhesive wafer carrier (e.g., a 200 mm or 300 mm panel or wafer carrier) for fan-out assembly, including molding, plating (e.g., Cu plating) and package level singulation. In such a fan-out process, pre-assembled leadframe, die and clip assemblies may be arranged on the adhesive panel or wafer carrier in rows and columns, such as in a similar arrangement as semiconductor dice are arranged on a semiconductor wafer during semiconductor manufacturing processes.

The manufacturing methods described herein also include manufacturing process flows that include use of copperframe based assemblies (e.g., in strip or matrix configurations), where singulated die are attached to the individual leadframes of a strip or matrix and further processing (e.g., molding, plating, etc.) is performed on the strip or matrix. The methods of manufacturing described herein may have lower processing costs (overall manufacturing costs) than current approaches, as they can reduce, or eliminate, package level vias used to make electrical connections in a semiconductor package, which significantly increase packaging costs of current implementations.

At least some of the manufacturing process flows illustrated and described herein can allow for the use of a flat base leadframe. Such approaches can reduce manufacturing costs, as they remove dependencies on certain leadframe features/dimensions that may result in increased cost of a given package design (e.g., top-set, push-down (e.g., precision stamping) processing and/or half-etch depth tolerances for producing non-flat leadframes). The manufacturing process flows described herein can allow for efficient material utilization (e.g., only visually good parts may be assembled in fan-out assembly processes). Also, fan-out processes can allow for increased manufacturing efficiency as such processes allow for tight unit (e.g., package to package) pitch during molding operations (e.g., as compared to conventional leadframe assembly processes).

The packaged semiconductor devices and associated methods of manufacturing illustrated in the attached drawings and described herein can include or allow for any, or all of the advantages discussed herein. The various embodiments discussed below and shown in the drawings, while described with respect to including (being implemented using) a vertical MOSFET semiconductor die, can be used in conjunction with any number of different types of semiconductor devices, such as discrete device, application specific integrated circuits and so forth.

In each of the various drawings, a single packaged semiconductor device (e.g., single die or multi-die) is shown for purposes of illustration. It will be appreciated, however, that multiple packaged semiconductor devices can be produced together (e.g., at the same time) using such approaches. For instance, using a leadframe process (or a fan-out process), leadframes (which can also be referred to as baseframes) may be provided in strip or matrix form. Also, using a fan-out process, a 200 mm or 300 mm adhesive panel or wafer carrier including a plurality of pre-assembled semiconductor dice, leadframes and clips (which can be referred to as "pre-assemblies") can be processed together to produce a plurality of packaged semiconductor devices from a corresponding plurality of pre-assemblies. It is noted that any dimensions shown in the drawings, or described herein, are given by way of example and particular dimensions will depend on the specific implementation.

FIG. 1A is a diagram illustrating a top-side view of a packaged semiconductor device 100, according to an implementation. The packaged semiconductor device (device) 100 of FIG. 1A can be produced using a leadframe manufacturing process, such as the process 200 illustrated in FIG. 2 and described below. The device 100 shown in FIG. 1A can be referred to as a top drain exposed packaged device. As illustrated in FIG. 1A, the device 100 includes a drain contact/heat slug pad 110 (e.g., that is electrically and thermally coupled with a bottom-side drain contact of a vertical MOSFET semiconductor die 140). The drain contact/heat slug pad 110, as shown in FIG. 1A, can be surrounded by a molding compound 120 and formed on, or as part of a clip 110 (shown in FIG. 1B) that is attached (e.g., soldered) to the back-side of a semiconductor die 140 including the vertical MOSFET.

For purposes of clarity, as discussed herein, the clip and drain contact/heat slug pad of the device 100 are both referenced as 110 in FIGS. 1A and 1B and may be referred to, interchangeably, as clip 110 or drain contact/heat slug pad 110. It will be appreciated that the clip and drain contact/heat slug pad of the device 100 (as well as other implementations described herein) can be a single structure, or can include multiple structures. For instance, the clip 110 may be a copper clip and that has plating (e.g., conductive plating) formed thereon to form a heat slug and/or drain contact pad. In other implementations, other arrangements are possible.

FIG. 1B is a diagram illustrating a side, cross-sectional view of the packaged semiconductor device 100 along section line 1B-1B of FIG. 1A. As shown in FIG. 1B, the device 100 of FIG. 1A can include a leadframe 130, a semiconductor die 140 (e.g., a vertical FET semiconductor die) attached to the leadframe 130, and the clip 110 electrically attached to (coupled with) the die 140 (e.g., a bottom-side drain contact of the die 140) and also electrically attached to (coupled with) the leadframe 130. In an implementation, the packaged semiconductor device 100 can have an overall thickness T1 (e.g., final thickness) of less than or equal to approximately 285 µm. The leadframe 130 and the clip 110 may be attached to the die 140 using a number of approaches, such as solder, a conductive die attach, a conductive adhesive, and so forth. The clip 110 may include a pushed-down portion 110a that electrically contacts at least a portion of the leadframe 130 (e.g., to establish an electrical connection between the drain contact of the die 140 and the leadframe 130 through the clip 110). The pushed-down portion 110a can be formed using a metal deformation process (which may also be referred to as a push-down process, a stamping process, and so forth) that is may performed on the clip 110, such as is illustrated by FIG. 1B. As shown in FIG. 1B, after the push-down process, the clip 110 has an L-shaped metal deformation, the pushed-down portion 110a, can include a surface that defines a plane that can be used to establish electrical contact with a portion of the leadframe 130, while the non-pushed down portion of the clip 110 can include a surface (defining a second plane) that is exposed through the molding compound 120 (e.g., which can be plated to defined a final drain contact pad for the packaged semiconductor device 100.

FIG. 1C is a diagram illustrating a bottom-side view of the packaged semiconductor device 100 of FIG. 1A. In FIG. 1C, contact pads defined by three leadframe portions 130a, 130b and 130c are shown. As shown in FIG. 1C, each of the leadframe portions 130a, 130b and 130c has a surface that is exposed through the molding compound 120. In the device 100 of FIG. 1, the leadframe portion 130a can define a source contact pad for the vertical FET of the die 140, the leadframe portion 130b can define a gate contact pad for the vertical FET of the die 140 and the leadframe portion 130c can define a drain contact pad for the vertical FET of the die 140. As noted above, the electrical connection from the leadframe portion 130c to the drain contact on the back-side of the semiconductor die 140 can be established through the clip 110, such as is illustrated in the top portion of FIG. 1B. In comparison, electrical connections between the source contact pad (130a) and the gate contact pad (130b) of the leadframe 130 can be made, respectively, between the respective leadframe portions 130a and 130b and corresponding contact pads (e.g., bond pads, solder bumps, landing pads, etc.) on the top-side of the die 140, such as using the manufacturing process 200 shown in FIG. 2.

As noted above, FIG. 2 is a flow diagram illustrating a manufacturing process 200 that can be used to produce the packaged semiconductor device 100 illustrated in FIGS. 1A-1C, according to an implementation. As shown in FIG. 2, at block 205, a baseframe (e.g. a Cu leadframe) can be provided. Again, as noted above, while a single baseframe (leadframe) 130 is shown in FIG. 2, multiple baseframes (leadframes) 130 may be provided in a strip or matrix configuration. In such approaches, the separate leadframes 130 can be connected by tie-bars that are cut when individual packaged semiconductor devices corresponding with each leadframe are singulated (e.g., separated into individual packaged semiconductor devices 100). As shown in block 205 of the process flow 200, the leadframe 130 can include a source portion 130a, a gate portion 130b and a drain portion 130c, which correspond with the exposed portions of the leadframe 130 shown in FIG. 1C.

As shown in block 210 of FIG. 2, a solder print 212 can be performed on the leadframe portions 130a, 130b and 130c for establishing respective source, gate and drain connections, and the semiconductor die 140, at block 215, can then be flip attached (e.g., using a solder reflow process) to the leadframe 130 (which can establish the source and gate electrical connections from the die 140 to, respectively the leadframe portions 130a and 130b). At block 220, another solder print (die print) 222 can be performed on the back-side (e.g., drain contact) of the die 140. At block 225, the clip 110 of the packaged semiconductor device 100 can be attached to the die 140 and the leadframe portion 130c via, respectively, the solder print 222 and the solder print 212. The clip attach operation at block 225 can include a solder reflow process (which can be a same reflow process, or a different reflow process, that is used to attach the leadframe portions 130a and 130b to the semiconductor die 140).

In the process flow 200, at block 230, the leadframe 130, die 140 and clip 110 (which may be mounted on a tape (not shown) attached to the leadframe, e.g., such as part of a strip or matrix of leadframes) can be molded using an appropriate molding process, such as injection molding or compression molding. In such an approach, the tape (which can be a UV tape) can prevent molding compound 120 from being disposed on (covering, obscuring, etc.) the contact pads of the leadframe portions 130a, 130b and 130c. However, during the molding process at block 230 of FIG. 2, molding compound 120 can cover the clip 110 and, at block 235, a grind operation can be performed to reduce a thickness of the packaged semiconductor device 100, as well as to expose, at least a portion of, the clip 110. The clip 110 can then be plated, at block 240, using any number of appropriate techniques, such as electroless plating, or solder print and reflow to form the drain contact/heat slug pad 110 shown in FIG. 1A. In other implementations, a separate heat slug structure can be attached to the clip 110, such as using solder, conductive adhesive, or other appropriate material. The plating (or heat slug attachment) at block 240 can define a drain contact pad 110 that has a surface area, length and width that are the same as or different than, respectively, a surface area, length and width of the exposed portion of the clip 110 after the grind operation of block 235.

In the process flow 200, at block 245, a saw singulation process can be performed to separate individual packaged semiconductor devices (e.g., in a strip or matrix form) from one another. In the process flow 200 of FIG. 2, at block 250, a bottom-side of the packaged semiconductor device 100 is shown, where the device 100 is inverted from the orientation of the device 100 shown in block 235 (e.g., is shown in a same orientation as in FIG. 1C. As illustrated in block 250, the contact pads of the leadframe portions 130a, 130b and 130c are exposed thorough molding compound 120, which can facilitate connection of the device 100 with a circuit board. Such implementations allow for low thermal resistance on both sides (e.g., efficient cooling from at least the top-side and the bottom-side) of the device 100, as the leadframe 130 and the clip 110 may have high thermal conductivity (e.g., as compared to the molding compound 120 or other materials that can be included in the device 100).

Figure 3:
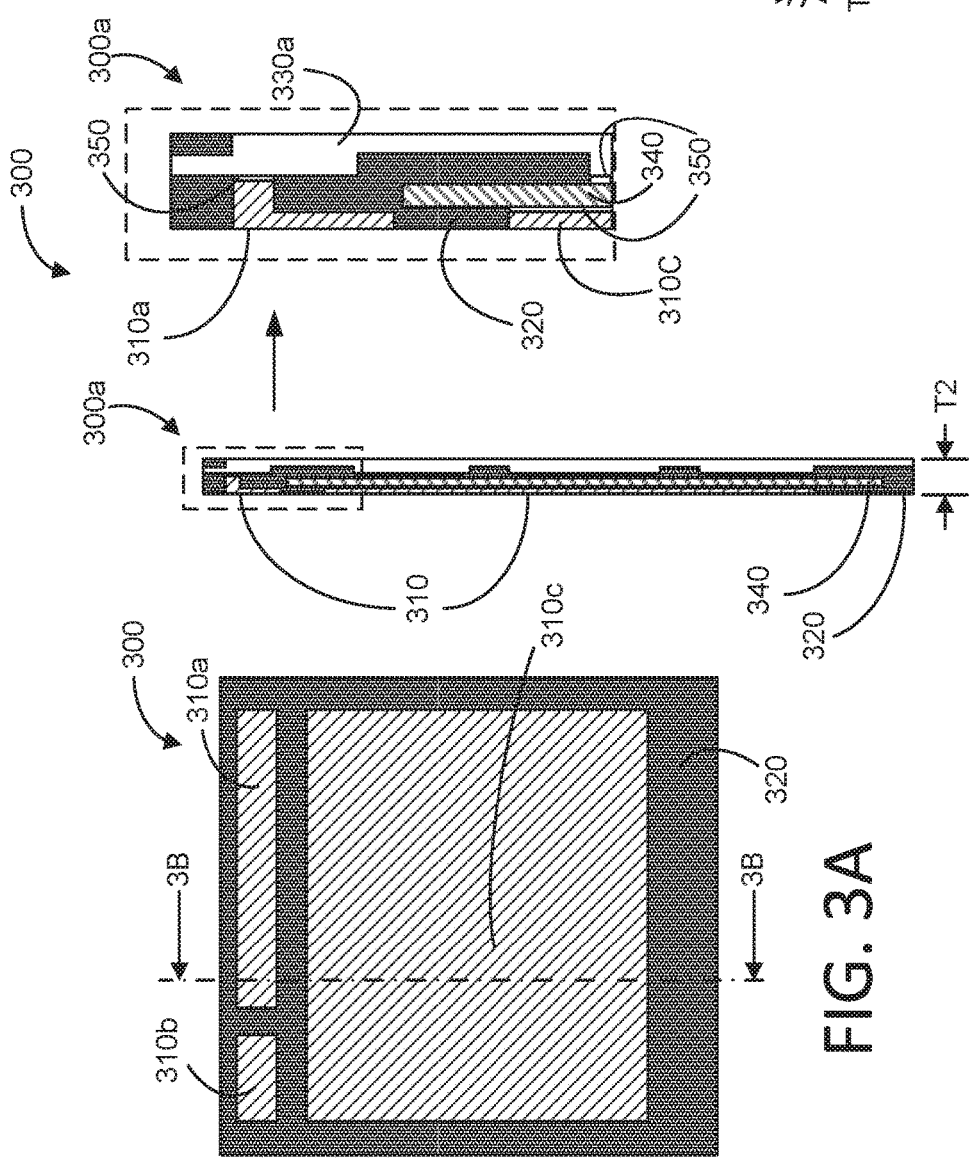
FIG. 3A is a diagram illustrating a top-side view of another packaged semiconductor device, according to an implementation.
FIG. 3B is a diagram illustrating a side, cross-sectional view of the packaged semiconductor device of FIG. 3A including a magnified view of a portion of the cross-sectional view.
FIG. 3C is a diagram illustrating a bottom-side view of the packaged semiconductor device of FIG. 3A.
FIG. 3D is a diagram illustrating a bottom-side view of the packaged semiconductor device of FIG. 3A after application of a laminate.

FIG. 3A is a diagram illustrating a top-side view of another packaged semiconductor device (device) 300, according to an implementation. The device 300 of FIG. 3A can be produced using a leadframe (e.g., a stamped or die cut Cu leadframe) process flow (e.g., a process 400 shown in FIG. 4) that is similar to the process flow 200 shown in FIG. 2. However, in comparison with the device 100 of FIGS. 1A-1C, the top-side of the device 300 of FIG. 3A includes a gate contact pad 310b and a drain contact pad 310c, in addition to a source contact pad 310a, where the contact pads 310a, 310b and 310c can be formed, in part, by plating formed on corresponding portions of a clip 310 (e.g., such the clip 310 illustrated in, at least, FIG. 3B and FIG. 4).

FIG. 3B is a diagram illustrating a side, cross-sectional view of the device 300 along section line 3B-3B of FIG. 3A, including a magnified view of a portion 300a of the cross-sectional view. As shown in FIG. 3B, the device 300 includes a leadframe 330, a die 340 attached to the leadframe 330 (e.g., including multiple leadframe portions) and a clip 310 (e.g., including multiple clip portions) attached to the die 340 and the leadframe 330. In an implementation, the packaged semiconductor device 300, as shown in FIG. 3B, can have an overall thickness T2 of less than or equal to approximately 225 μm.

The magnified portion 300a of the cross-sectional view is also shown on a right side of FIG. 3B (i.e., the portion set off by dashed lines in FIG. 3B). The magnified portion 300a of the cross-sectional view of the device 330 more clearly shows how electrical connections 350 between the clip 310 and the leadframe 330, the clip 310 and the die 340 and the leadframe 330 and the die 340 can be established, e.g., with a solder print, or other conductive material disposed between the clip 310 and the leadframe 340. As with the packaged semiconductor device 100 of FIGS. 1A-IC, the electrical connections 350 between the die 340, the leadframe 330 and the clip 310 of the device shown in FIG. 3B can be formed in a number of ways, such as using reflowed solder joints, conductive adhesive, and so forth.

FIG. 3C is a diagram illustrating a bottom-side view of the device 300 of FIG. 3A. As with the device 100 of FIG. 1C, portions of the leadframe 330 of the device 300 in FIG. 3C are exposed through the molding compound 320. In this implementation, as compared with FIG. 1C, only a source contact pad 330a and a gate contact pad 330b are included on the bottom side of the device 300 in FIG. 3C (e.g., the leadframe 330 only has two portions, as compared to the three portions of the leadframe 130 of the device 100). Because the top-side (e.g., clip-side) of the device 300 of FIG. 3C (as shown in FIG. 3A) includes the source (310a), gate (310b) and drain (310c) contact pads, the top-side of the device 300 may be used to mount the device 300 on a corresponding circuit board.

Depending on the particular implementation, the bottom-side of the device 300, as shown in FIG. 3C, can be covered (e.g., with a laminate cover that is bonded to the device 300) so as to prevent electrical shorts from occurring (e.g., between the source contact pad 330a and the gate contact pad 330b) when the device 300 is implemented on a circuit board and/or a heat sink or heat slug is attached to the device 300, such as in implementations where the top-side of the device 300, as shown in FIG. 3A, is used to attach the device 300 to a circuit board.

FIG. 3D is a diagram illustrating a bottom-side view of the device 300 of FIG. 3C after application of such a laminate 360. In an example implementation, the laminate 360 may have a thickness of 50 μm and cover the exposed source 330a and gate 330b portions of the leadframe 330 shown in FIG. 3C. Accordingly, in this example implementation, the packaged semiconductor device 300, as shown in FIG. 3D can have an overall thickness T3 (e.g., final thickness), including the laminate 360, of less than or equal to approximately 275 μm (e.g., the thickness of 225 μm as shown in FIG. 3B plus the 50 μm thickness of the laminate 360. In other implementations, the laminate 360 may have other thicknesses. Depending on the particular implementation, the laminate 360 can be formed from a number of different materials. For instance, the laminate 360 could be formed from ceramic, glass, a thermoset epoxy-based material, a polymer layer, and so forth. The laminate 360 can be affixed to the bottom-side of the device 300 using a UV tape, a non-conductive epoxy, or other appropriate material. In other implementations, the laminate 360 can also be affixed to the bottom-side of the device 300 using a compression molding lamination process.

Figure 4:
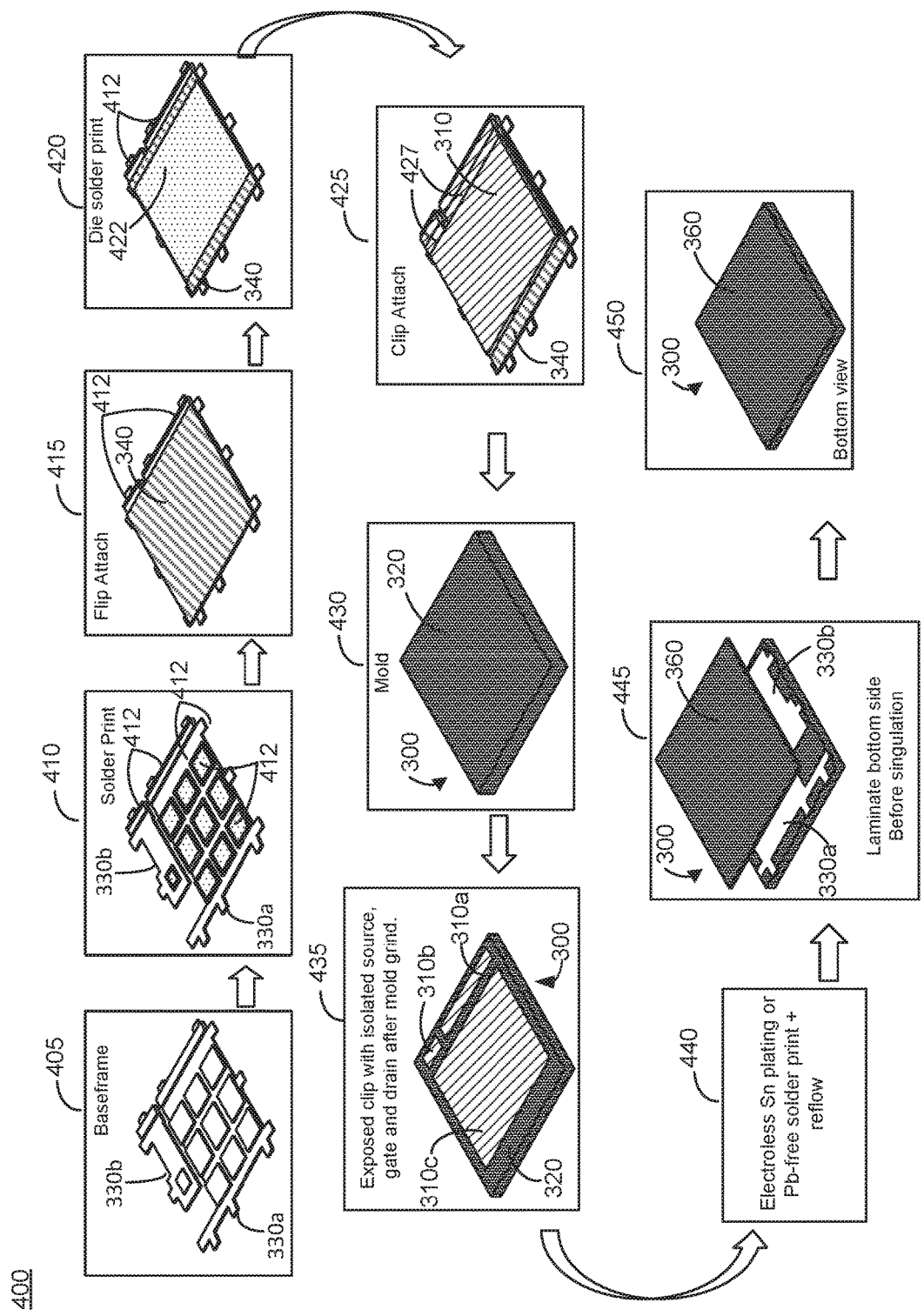
FIG. 4 is a flow diagram illustrating a manufacturing process that can be used to produce the packaged semiconductor device illustrated in FIGS. 3A-3D, according to an implementation.

FIG. 4 is a flow diagram illustrating a manufacturing process (process flow) 400 that can be used to produce the device 300 illustrated in FIGS. 3A-3D, according to an implementation. In this example implementation, the process flow 400 of FIG. 4 is similar to the process flow 200 of FIG. 2. For instance, blocks 405, 410, 415 and 420 of the process flow 400 correspond, respectively, with blocks 205, 210, 215 and 220 of the process flow 200, where a solder print 412 is performed on the leadframe 330a and 330b portions of the device (block 410), the die 340 is flip attached (block 415) and a die print 422 is performed on the back-side of the die 340 (block 420). Accordingly, each such operation of the process flow 400 of FIG. 4 will not be described in detail again here with respect to FIG. 4. Instead, the following discussion of FIG. 4 will note differences between the process flow 200 of FIG. 2 and the process flow 400 of FIG. 4. For instance, as noted above and as is shown in block 405 of FIG. 4, the baseframe (leadframe) 330 of the device 300 includes only a source portion 330a and a gate portion 330b. That is, the leadframe 330 for the device 300 of FIGS. 3A-3D (and the process flow 400 of FIG. 4) does not include a drain portion. As previously noted, while a single leadframe 330 is shown in FIG. 4, in certain implementations, multiple leadframes can be provided together (e.g., such as in a strip or matrix arrangement on an adhesive tape)

As shown in block 425 of FIG. 4, the clip 310 of the device 300 can include half-etch tie-bars 427 that connect the source portion 310a and the gate portion 310b with the drain portion 310c (not individually referenced in block 425). In such an approach, the clip 310 (prior to being attached to the leadframe 330 and the die 340 at block 425) can be etched (e.g., using a photomasking and etch process) to define the half-etch tie-bars 427 shown in block 425. For example, such an etch process may reduce a thickness of the clip 310 (e.g., by half) in the area of the tie-bars 427.

After molding the device 300 at block 430, a top-side of the device 300 can be ground, at block 435, to expose the source 310a, gate 310b and drain 310c contact pads of the clip 310. During the grinding process of block 435, the half-etch tie bars 427 may be removed during (as a result of) the grinding, as the tie-bars 427 have a reduced thickness as compared to the other portions of the clip 310. This removal of the tie-bars 427 electrically isolates the source contact pad 310a and the gate contact pad 310b from the drain contact pad 310c (and, therefore, also electrically isolating the source contact pad 310a and the gate contact pad 310b from each other). After perform plating (at block 440) to define the source 310a, gate 310b and drain 310c contact pads, such as shown in FIG. 3A, at block 445, the laminate 360 can be applied to the back-side (leadframe 330 side) of the device 300 and individual packaged semiconductor devices can be singulated from each other, e.g., using saw singulation or any other appropriate approach. As illustrated in block 450, the leadframe portions 330a and 330b can be covered by the laminate 360, which can prevent the occurrence of electrical shorts between the leadframe portions when attaching the device 300 to a circuit board and/or when attaching a heat sink or heat slug to the device 300.

Figures 5A, 5B:
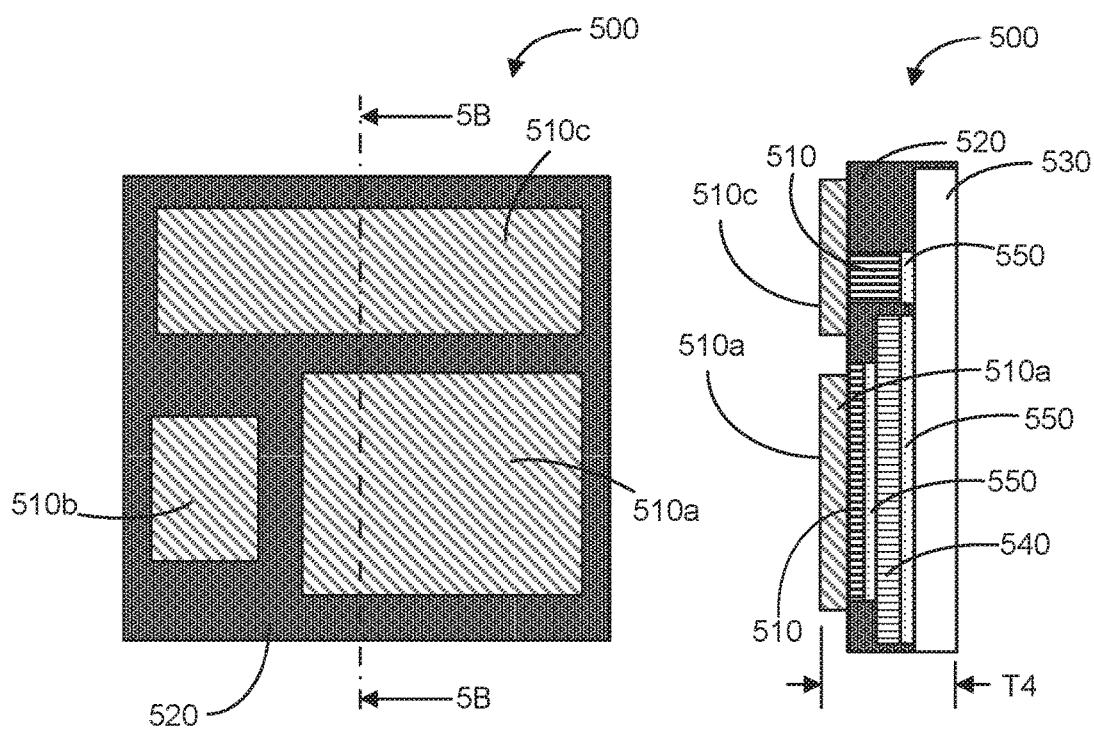
FIG. 5A is a diagram illustrating a bottom-side, schematic view of yet another packaged semiconductor device, according to an implementation.
FIG. 5B is a diagram illustrating a side, cross-sectional view of the packaged semiconductor device of FIG. 5A.

FIG. 5A is a diagram illustrating a top-side, schematic view of yet another packaged semiconductor device (device) 500, according to an implementation. FIG. 5B is a diagram illustrating a side, cross-sectional view of the device 500 along section line 5B-5B of FIG. 5A. The device 500 of FIGS. 5A and 5B can be produced using a fan-out assembly process, such as a process flow 600 illustrated in FIG. 6 and described below. As shown in FIG. 5A, the device 500 can include a source contact pad 510a, a gate contact pad 510b and a drain contact pad 510c that are defined, at least in part, by a clip 510, such as using plating that is formed on a surface of the device 500 to create conductive pads to each corresponding portion (source, gate and drain) of the clip 510.

As illustrated in 5B, the device 500 of FIG. 5A (e.g., produced by a fan-out assembly process) can include a flat baseframe (e.g., a flat Cu leadframe) 530 that is attached (e.g., using a solder print and reflow process, or other die-attach process) to a back-side surface (e.g., drain contact of a vertical MOSFET) of a semiconductor die 540. The flat baseframe (leadframe) 530 can be exposed through a molding compound 520 of the device 500, such as shown in FIG. 5B. In such an approach, the exposed baseframe 530 can provide high thermal conductivity for heat generated by the semiconductor die 540 (during operation) out of the device 500 with exposing the backside of the semiconductor die 540.

As shown in FIG. 5B, the device 500 can also include the clip 510 can include multiple portions that are respectively connected (e.g., using a solder print and reflow process) to form electrical connections 550 with gate pads (e.g., gate bond pads) and source pads (e.g., source bond pads) on a top-side surface of the semiconductor die 540. The clip 510 may also have another portion that has a solder (electrical) connection 550 to the baseframe 530 (e.g., to establish an electrical connection to the drain contact (back-side the semiconductor die 540) with the drain contact pad 510c on the top-side of the device 500 (e.g., as shown in FIG. 5A). As also illustrated in FIG. 5B, the separate portions of the clip 510 may also be plated to define a desired contact pad layout for the source contact pad 510a, the gate contact pad 510b and the drain contact pad 510c, where each area of plating (e.g., 510a, 510b and 510c) can be of a same size, or of a different size as its corresponding portion of the clip 510 that is exposed through the molding compound 520.

In example implementations, the device 500 can have an overall (final) thickness T4 of less than or equal to approximately 310 μm. For instance, the leadframe 530 may have a thickness of 100 μm (e.g., approximately 100 μm), the die 540 may have a thickness of 61 μm (approximately 61 μm), the electrical (e.g., solder) connection 550 between the leadframe 530 and the die 540 may have a thickness of 20 μm (e.g., approximately 20 μm), the plating and clip/heat slug may have a combined thickness of 55 μm (e.g., approximately 55 μm), the electrical (e.g., solder) connection 550 between the clip 510 and the die 540 (and the clip 510 and leadframe 530) may have a thickness of 20 μm (e.g., approximately 20 μm). In such an implementation, the packaged semiconductor device 500 can have an overall (final) thickness of approximately 256 μm. In implementations of the packaged semiconductor device 500 that include a laminate layer, such as the 50 μm thick laminate layer 360 described above, the packaged semiconductor device 500 can have an overall (final) thickness T4 of approximately 306 μm.

Figure 6:
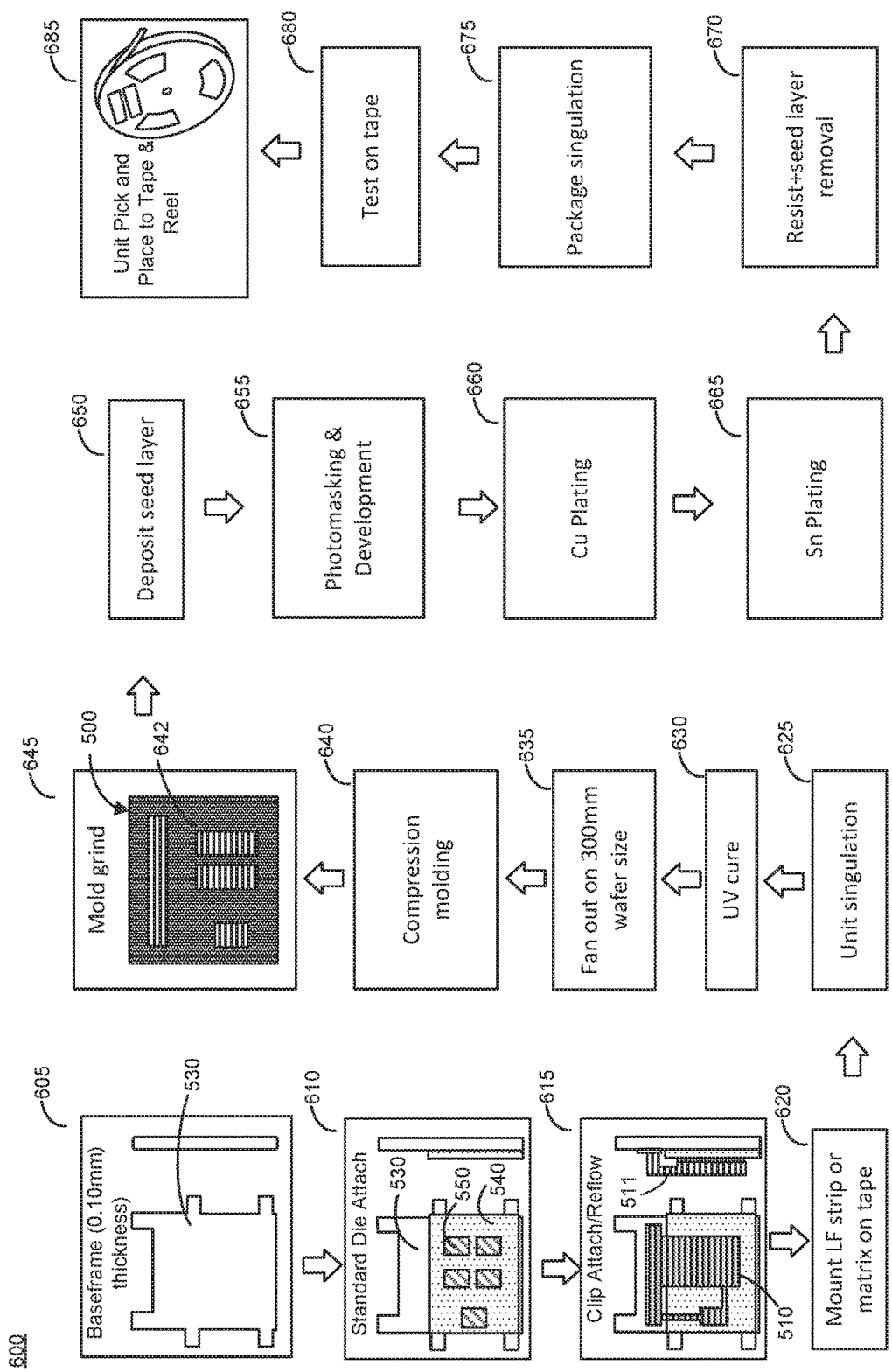
FIG. 6 is a flow diagram illustrating a manufacturing process that can be used to produce the packaged semiconductor device illustrated in FIGS. 5A-5B, according to an implementation.

FIG. 6 is a flow diagram illustrating a manufacturing process (process flow) 600 that can be used to produce the device 500 illustrated in FIGS. 5A-5B, according to an implementation. As shown at block 605 in FIG. 6, the flat baseframe (leadframe) 530 of FIG. 5 B can be provided. As previously noted, while a single baseframe 530 is shown in FIG. 6, in certain implementations, multiple baseframes 530 can be provided together (e.g., such as in a strip or matrix arrangement on an adhesive tape). At block 610, a singulated semiconductor die 540 can be attached to the baseframe 530 (e.g., drain contacts of singulated semiconductor dice 540 can be attached to respective baseframes 530). As shown in block 610, the die 540 can include electrical connections 550, such as to the source and gate terminals of a FET device included on the semiconductor die 540. The electrical connections 550 can be solder bumps, bond pads, contact pads, or any other appropriate structure for establishing electrical connection to from clip 510 to the top-side (front-side) of the die 540.

After the die attach operation at block 610, the process flow 610, at block 615, can include attaching the clip 510 (or clips 510 for multiple devices) to the top-side of the semiconductor die 540 (or respective top-sides of the semiconductor dice 540). The different contact pad sections (e.g., gate, source and drain) of the clip 510 may be connected to each other with half-etch tie-bars, such as those previously discussed. The die attach operation (610) and clip attach operation (615) may be performed using a number of approaches, such as those described herein. For instance, one or more solder print and reflow processes may be used to affect attachment of the die 540 and the clip 510.

After the clip attach operation at block 615, a group of baseframes 530 (in strip or matrix form) with individual semiconductor dice assemblies (e.g., each including the baseframe 530, the die 540 and the clip 510) can be, at block 620, mounted on a UV sensitive tape and, at block 625, singulated into individual pre-assemblies, such as using saw singulation, laser cutting singulation, etc. At block 630, a UV cure can be performed (e.g., to cure the UV adhesive tape on which the baseframes are mounted to facilitate removal of the pre-assemblies). The pre-assemblies can then, at block 635, be picked-and-placed onto an adhesive panel or adhesive wafer carrier for fan-out processing. For instance, at block 635, the singulated pre-assemblies can be fanned-out on a 300 millimeter adhesive (semiconductor wafer-size) panel.

As shown in FIG. 6 (e.g., as part of the fan-out processing of the process flow 600), at block 640, the leadframe, die and clip pre-assemblies can be molded on the panel of block 635, using, e.g., compression molding or other appropriate molding process. After molding, at block 645, a grinding operation can be performed to reduce package thickness and expose the contact pads of the clip 510, which can include removing half-etch tie-bars between the different portions of the clip 510.

At block 650, a plating seed layer can be deposited on the top side of the device 500. At block 655, photo-masking and development (photolithography) can be performed to define where plating is to be affected, so as to define a desired contact pad layout for the packaged semiconductor device, such as for the source contact pad 510a, the gate contact pad 510b and the drain contact pad 510c, as shown in FIG. 5A. One or more plating operations can then be performed, such as a Cu plating operation at block 660 followed by tin (Sn) plating operation at block 665. After the plating operations the process flow 600, at block 670, can include removing the remaining photoresist of block 655 and un-plated portions of the seed layer of block 650. At block 675, individual devices 500 can be singulated (e.g., using saw singulation or other approaches). The individual devices 500 can, at block 680, be tested while still on the fan-out adhesive panel or wafer carrier of block 635. After testing at block 680, the devices 500 that pass testing can, at block 685 (e.g., after a UV cure operation in some implementations) be picked-and-placed into a tape and reel holder (or other shipping container) for shipment (transfer) to a circuit board assembly facility.

Figure 7:
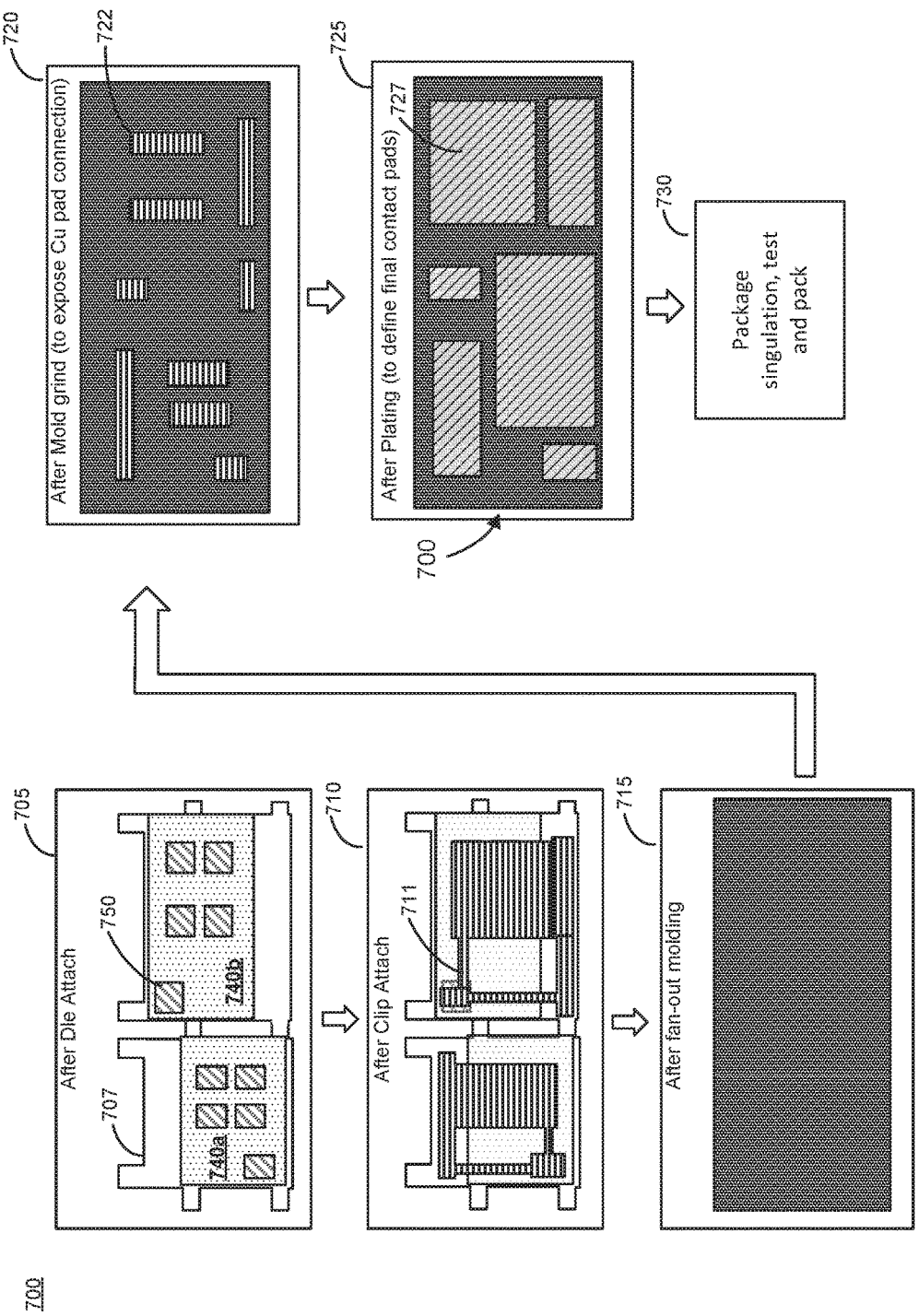
FIG. 7 is a flow diagram illustrating a manufacturing process that can be used to produce a packaged semiconductor device including multiple semiconductor die, according to an implementation.

FIG. 7 is a flow diagram illustrating a manufacturing process (process flow) 700 that can be used to produce a packaged semiconductor device 700 that includes multiple semiconductor die, according to an implementation. As shown in FIG. 7, at block 705 of the process flow 700, multiple semiconductor die 740a and 740b can be attached to a leadframe (baseframe) 707. The leadframe 707 can be included in a leadframe strip or matrix. In the process flow 700 of FIG. 7, back-sides (e.g., drain contacts) of two vertical FET semiconductor dice 740a and 740b can be attached to the leadframe 707, where each die 740a and 740b has a number of electrical connection points 750 for establishing electrical connections with, e.g., gate and source terminals of the vertical FETs of the dice 740a and 740b.

At block 710, respective clips 711 can then be attached to the semiconductor dice 740a and 740b, such as using the approaches described herein. The clips 711 can include half-etch tie-bars between separate portions of the clips 711 (e.g., between source, gate and drain portions). At block 715, a fan-out process can then be performed including placement of leadframe, die and clip assemblies (pre-assemblies) on an adhesive panel or wafer carrier for fan-out processing, including molding (at block 715), grinding (at block 720) to expose contact pads 722 of the clip 710 through a molding compound, plating (at block 725) to define the final source, gate and drain contact pads for the dual-FET device 700. As discussed with respect to the process flow 400 at block 435, the grind process of block 720 of the process flow 700 can eliminate (remove) the half-etch tie-bars of the clips 711. At block 730, the method 700 can include singulating individual devices 700, testing the devices 700 and packing the devices 700 that pass testing into an appropriate shipping container.

Figure 8A:
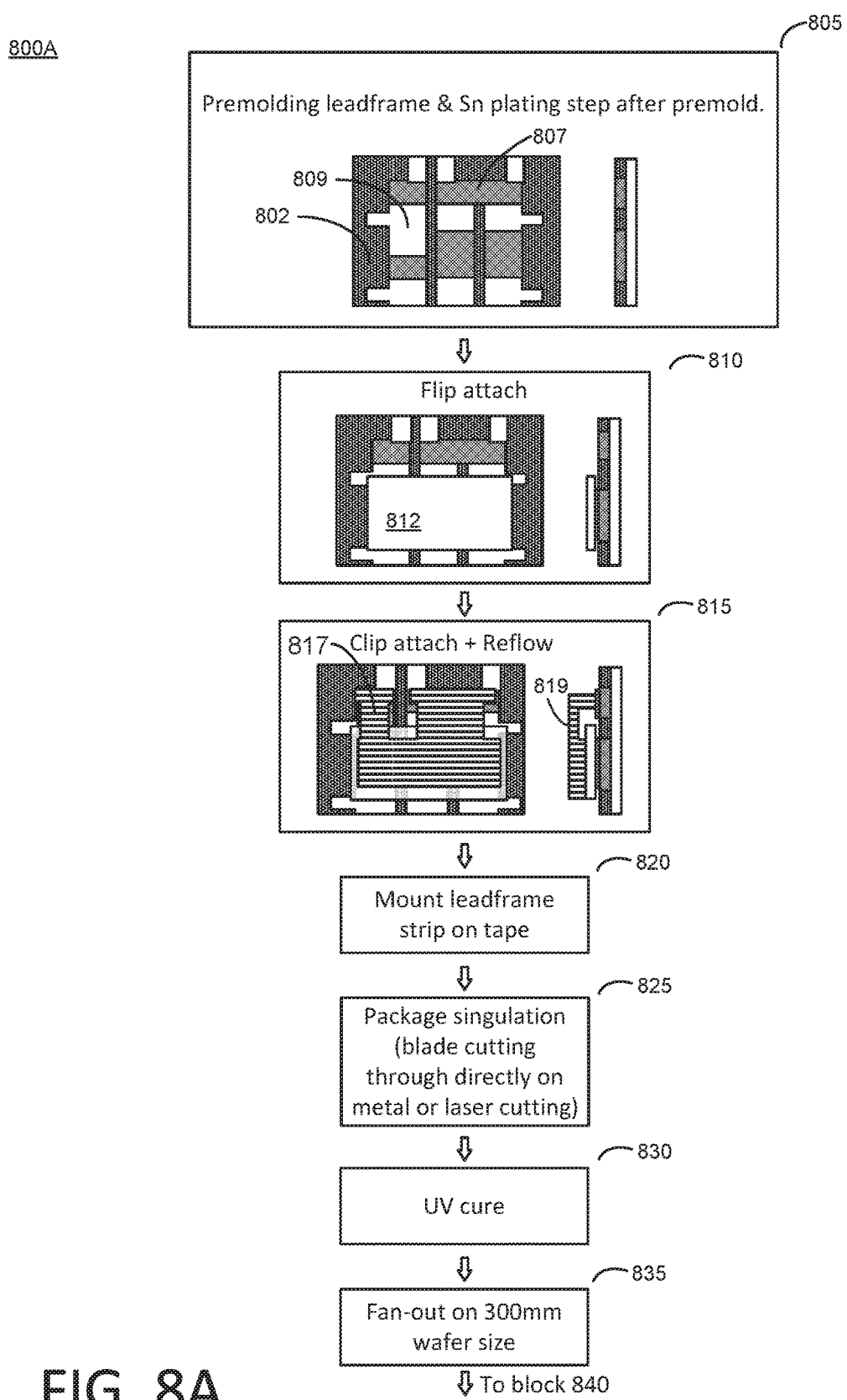
FIGS. 8A and 8B are flow diagrams illustrating a manufacturing process flow for assembly and test of a packaged semiconductor device, according to an implementation.
Figure 8B:
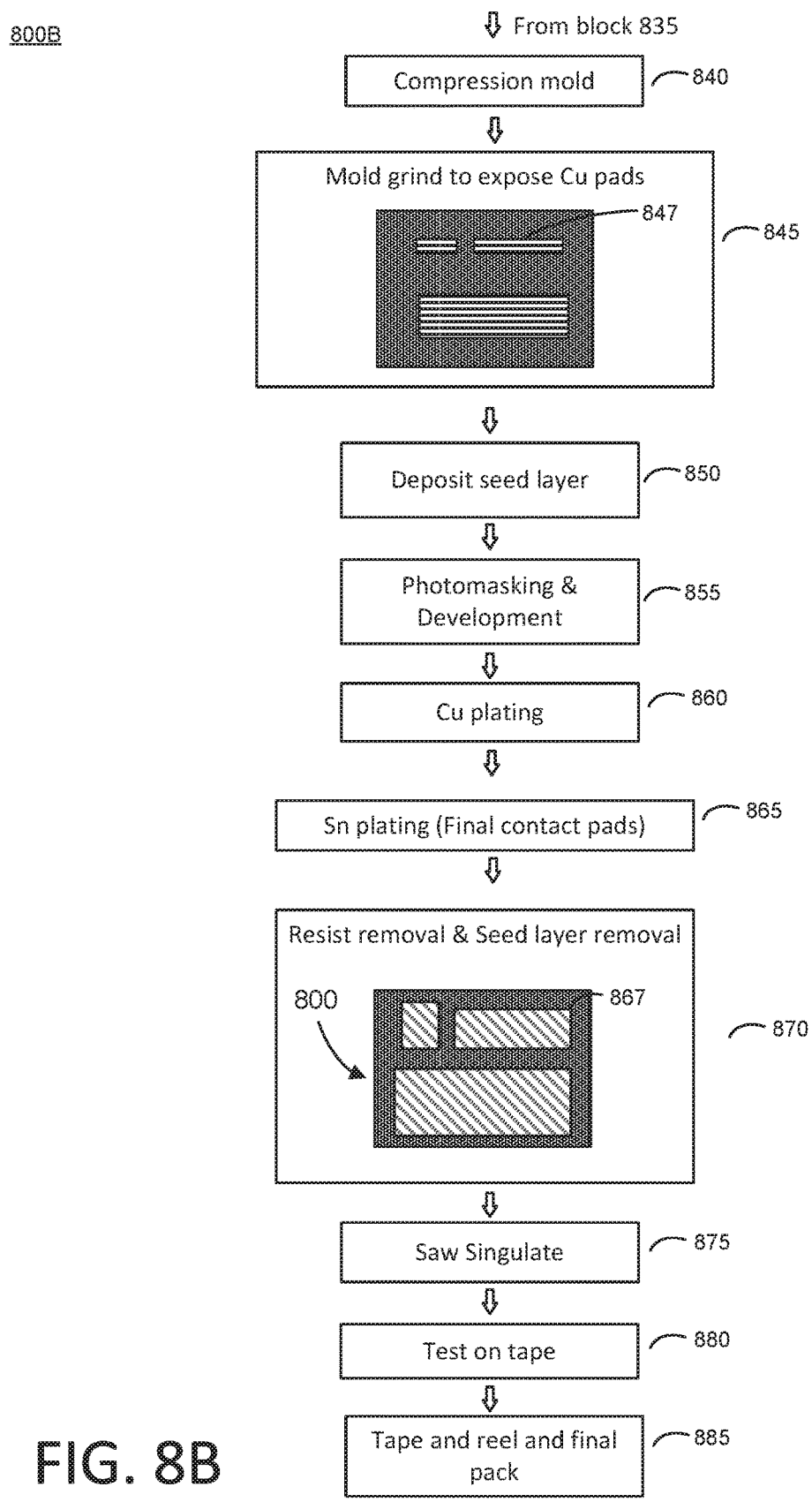

FIGS. 8A and 8B are a flow diagram illustrating a manufacturing process flow 800A, 800B for assembly and test of a packaged semiconductor device, according to an implementation. In the process flow of FIGS. 8A and 8B, the portion of the process flow illustrated in FIG. 8A is referenced as process flow 800A, while the portion of the illustrated in FIG. 8B is referenced as process flow 800B. As illustrated in FIG. 8A, at block 805, a leadframe (which can be included in a leadframe strip or matrix) can be pre-molded and Sn plating of the leadframe can be performed after the pre-molding. In one approach, the leadframe of the process flow 800A can include raised portions 807 and recessed portions 809 that are exposed through an upper surface of a molding compound 802. In another approach, only the raised portions 807 may be exposed through the molding compound 802 after the pre-molding operation of block 805, while the recessed portions are covered by the molding compound 802. In the process flow 800A, 800B, the raised portions 807 of the leadframe can be used to facilitate establishing electrical connections to a semiconductor die and/or a clip.

For instance, in the process flow 800A, at block 810, a semiconductor die 812 can be flip mounted on one or more of the raised portions 807 of the leadframe. At block 815, a clip 817 (e.g., including half-etch tie-bars between different portions of the clip 817) can be attached to the back-side of the semiconductor die 812 and one or more raised portions 807 of the leadframe, and a reflow process can be performed to secure the die 812 to the leadframe and to secure the clip 817 to the die 812 and to the one or more raised portions 807 of the leadframe. At block 820, the leadframe, die and clip assembly (pre-assembly) can then be mounted on an adhesive tape. For implementations using a strip or matrix of leadframes. at block 825, individual pre-assemblies (e.g., from the leadframe strip or matrix) can be singulated, such as using a saw or laser. At block 830, a UV cure can be performed to cure the adhesive tape, so as to facilitate removal of the singulated individual assemblies for fan-out processing at block 835.

As shown in FIG. 8B, at block 840 of the process flow 800B, compression molding can be performed on the fanned-out assemblies. At block 845, a grind operation can be performed to expose the contact pads 847 of the clip 817, as well as remove any half-etch tie-bars of the clip 817. At block 850, a plating seed layer can be deposited (e.g., sputtered) and, at block 855, photolithography (photomasking and development) can be performed to define the areas to be plated for the desired (final) contact pad 867 layout for the completed packaged semiconductor device 800. As shown in FIG. 8B, plating (e.g., Cu plating at block 860 and/or Sn plating at block 865) can be performed to define the final contact pads 867. At block 870, remaining photoresist and un-plated seed layer can then be removed, and, at block 875, the individual packaged semiconductor devices 800 can be singulated (e.g., saw singulated). At block, 880, testing of the singulated devices on an the adhesive panel or wafer carrier tape can be performed and, at block 885, the devices that pass testing at block 880 can be picked-and-placed into a tape and reel carrier, or other container for shipping to a circuit board assembly facility.

Figure 9A:
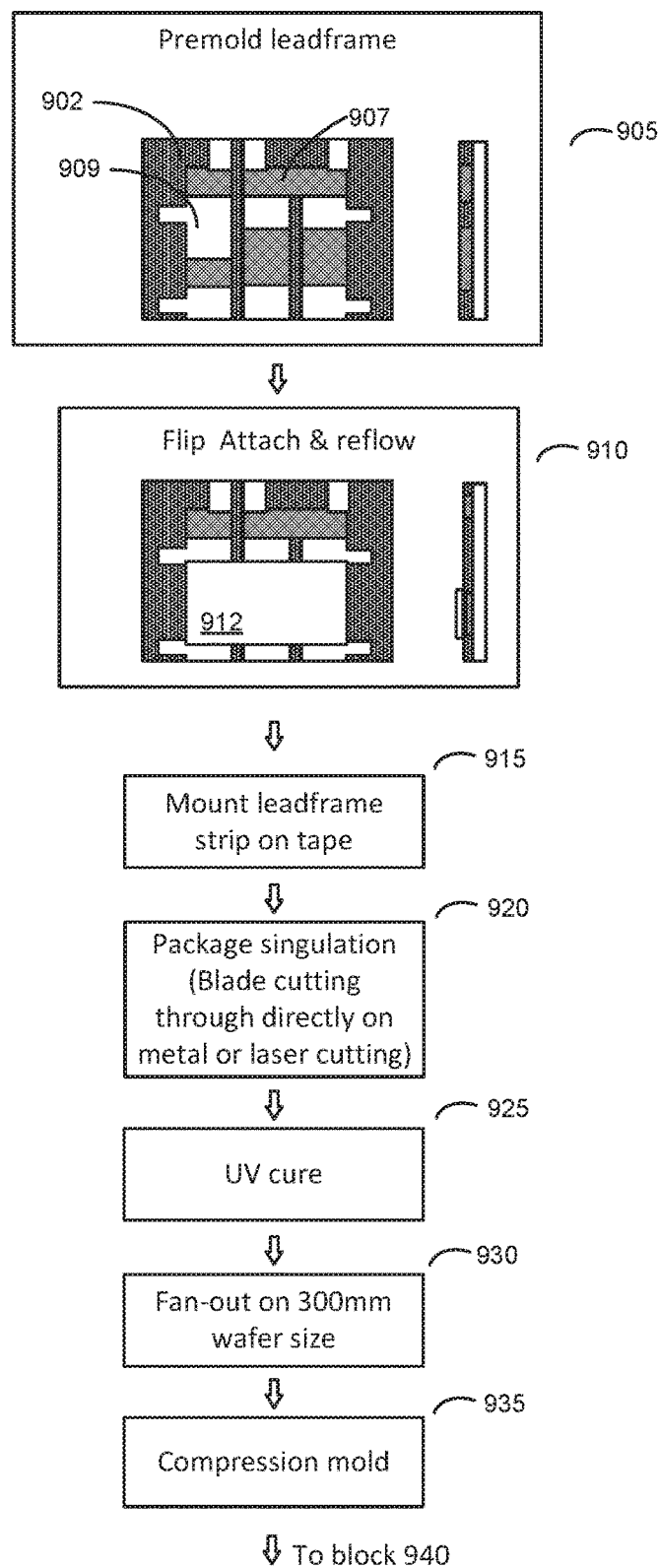
FIGS. 9A and 9B are flow diagrams illustrating another manufacturing process flow for assembly and test of a packaged semiconductor device, according to an implementation.
Figure 9B:
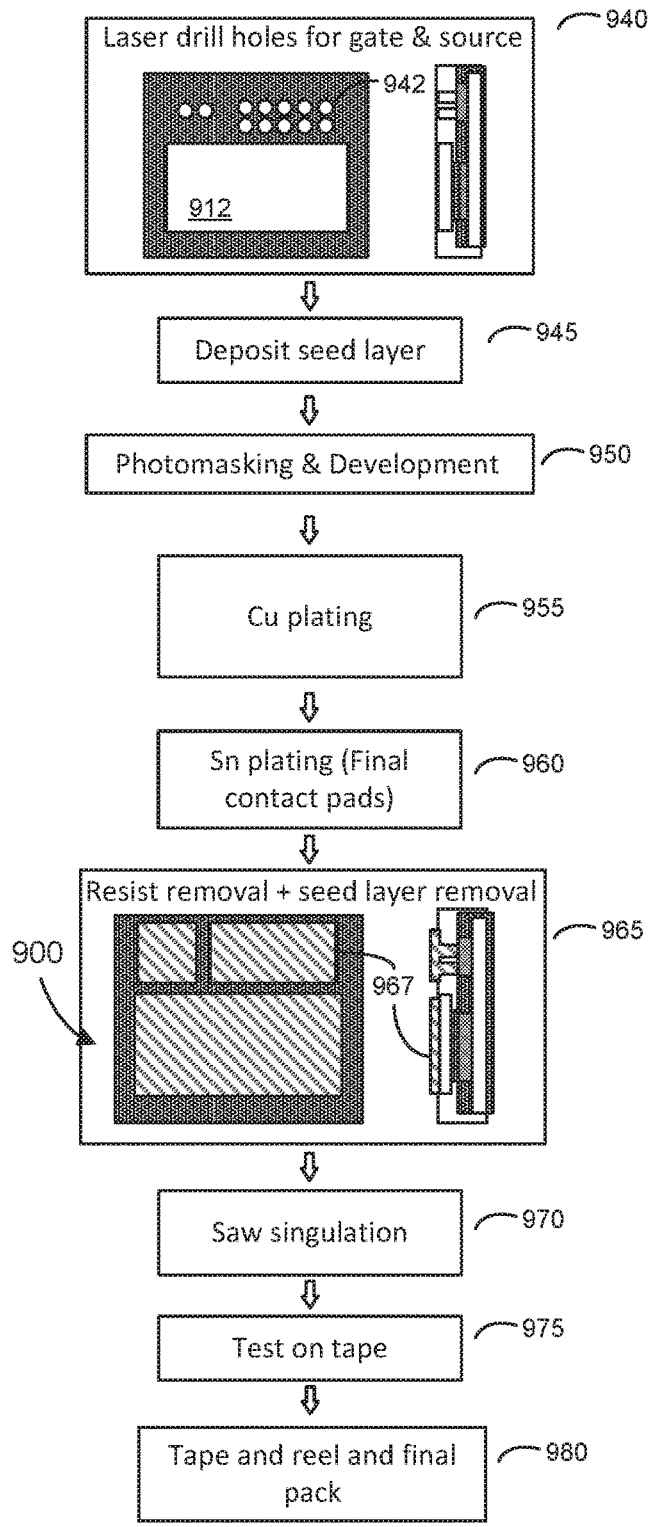

FIGS. 9A and 9B are a flow diagram illustrating another manufacturing process flow 900A, 900B for assembly and test of a packaged semiconductor device 900, according to an implementation. In the process flow of FIGS. 9A and 9B, as with the process flow 800A, 800B in FIGS. 8A and 8B, the portion of the process flow illustrated in FIG. 9A is referenced as process flow 900A, while the portion of the illustrated in FIG. 9B is referenced as process flow 900B. As shown in FIG. 9A, at block 905, a (Cu) leadframe (which can be included in a leadframe strip or matrix) can be pre-molded. As with the leadframe in FIGS. 8A and 8B, the leadframe of the process flow 900A can include raised portions 907 and recessed portions 909 that are exposed through an upper surface of a molding compound 902. In other approaches, only the raised portions 907 may be exposed through the molding compound 902 after the pre-molding operation of block 905, while the recessed portions are covered by the molding compound 902.

At block 910 of the process flow 900A, a pre-solder bumped semiconductor die 912 can be flip attached to one or more raised portions 907 of the leadframe, and a solder reflow process can be performed to establish electrical connections between terminal of the die 912 and the one or more raised portions 907 the leadframe on which the die 912 is disposed. At block 915, the leadframe and die assembly (which can be included in a strip or matrix of leadframe and die assemblies) can be mounted on adhesive tape and, at block 920, individual leadframe and die assemblies can be singulated. At block 925, a UV cure performed (to cure the adhesive tape to facilitate removal of the leadframe and die assembly). At block 930, the leadframe and die assembly can then be transferred (picked-and-placed, fanned-out, etc.) to an adhesive panel or wafer carrier for further assembly (fan-out) processing, including compression molding at block 935 of the process flow 900A.

As shown at block 940 in FIG. 9B, after the compression molding at block 935, a backside of the die 912 can be exposed through the molding compound 902 (e.g., with or without a grind operation). At block 940, laser drilling can be performed on the molded device to form openings 942 through the molding compound 902 to gate and source raised portions 907 of the leadframe. At block 945 of the process flow 900B, a seed layer can be deposited (sputtered) and, at block 950, photolithography (photomasking and development) can be performed to define the areas to be plated to define the contact pad layout 967 (e.g., source gate and drain contact pads) for the completed packaged semiconductor device 900.

As shown in FIG. 9B, plating (e.g., Cu plating at block 955 and/or Sn plating at block 960) can be performed to define the final contact pads 967. At block 965, remaining photoresist and un-plated seed layer can be removed. At block 970, individual packaged semiconductor devices 900 can be singulated (e.g., saw singulated). At block 975, testing of the singulated devices 900 on the adhesive panel or wafer carrier can be performed. The devices 900 that pass testing at block 975 can, at block 980, be picked-and-placed from the carrier of block 930 into a tape and reel carrier, or other container for shipping to a circuit board assembly facility.

Figure 10A:
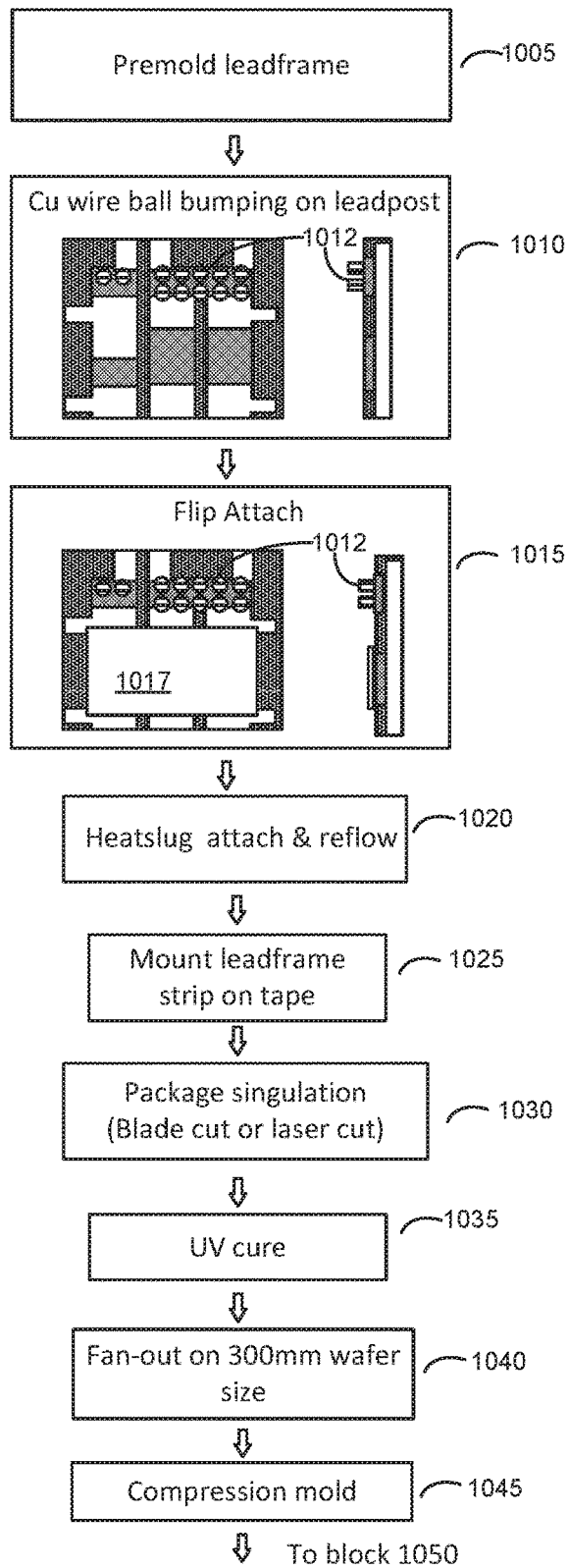
FIGS. 10A and 10B are flow diagrams illustrating yet another manufacturing process flow for assembly and test of a packaged semiconductor device, according to an implementation.
Figure 10B:
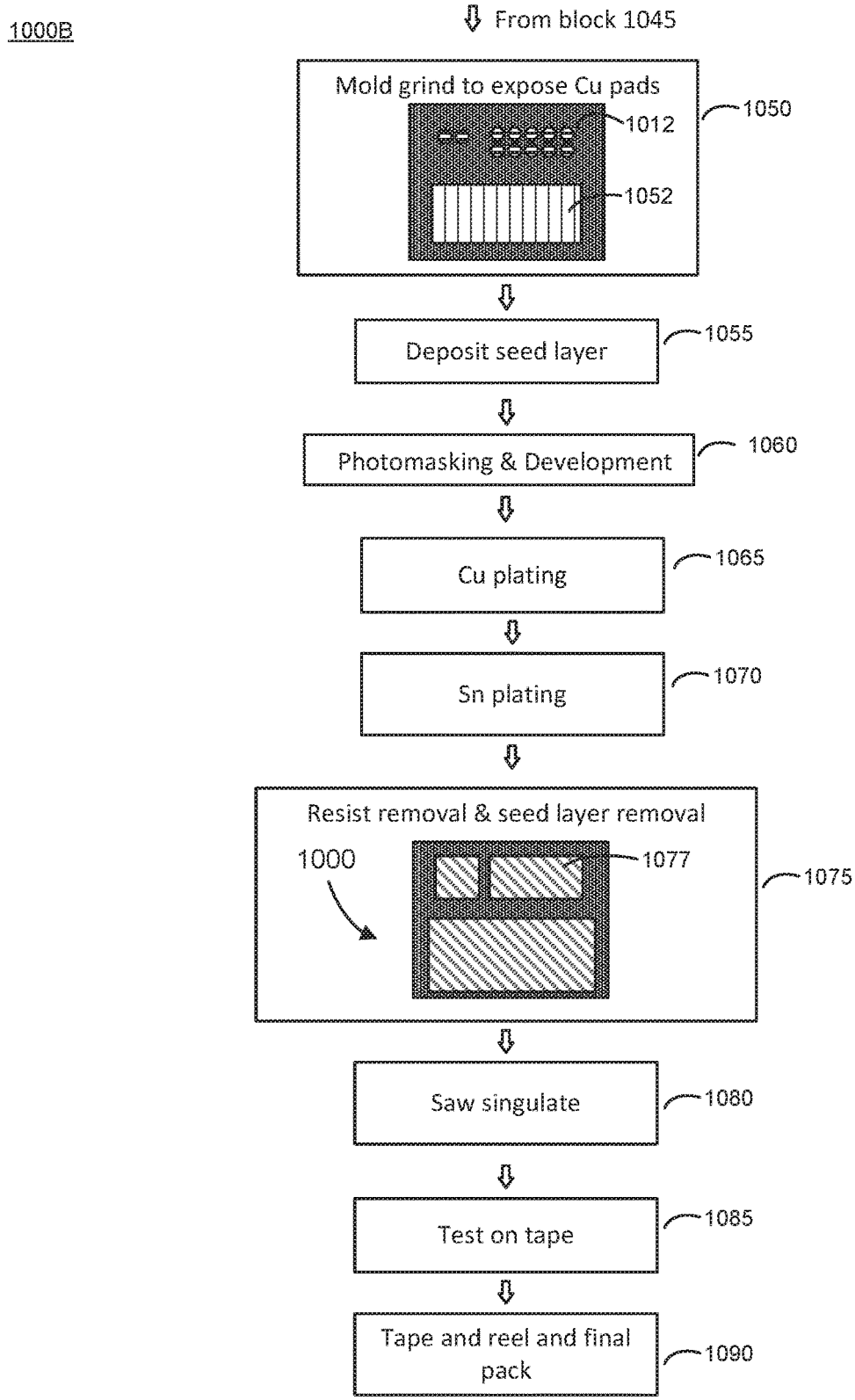

FIGS. 10A and 10B are a flow diagram illustrating yet another manufacturing process flow 1000A and 1000B for assembly and test of a packaged semiconductor device 1000, according to an implementation. In the process flow of FIGS. 10A and 10B, as with the process flows 800A, 800B in FIGS. 8A and 9B, and 900A, 900B in FIGS. 9A and 9B, the portion of the process flow illustrated in FIG. 10A is referenced as process flow 1000A, while the portion of the illustrated in FIG. 10B is referenced as process flow 1000B. As shown in block 1005 FIG. 10A, a leadframe can be pre-molded, such as in similar fashion as discussed above with respect to FIGS. 8A and 9A. At block 1010 of the process flow 1000A, Cu wire bumps (or other wire/conductive bumps) 1012 can be formed on raised (e.g., gate and source) portions of the leadframe. At block 1015, a pre-solder bumped die 1017 can be flip attached to one or more raised portions of the leadframe. At block 1020, a heat slug can be affixed (attached) to the back-side (e.g., drain contact) of the die 1017 (e.g., via solder print) and a reflow process performed (e.g., to reflow the die solder bumps and/or a solder between the die 1017 and the heat slug.

At block 1025, the leadframe, die and heat slug assembly (which can be included in a strip or matrix of leadframe, die and heat slug assemblies) can be mounted on an adhesive tape. At block 1030, individual leadframe, die and heat slug assemblies can be singulated (e.g., using a saw blade or laser cutting). At block 1035 of the process flow 1000A, a UV cure can be performed, so as to cure the adhesive tape of block 1024, to facilitate removal of the leadframe, die and heat slug assemblies. At block 1040, the singulated leadframe, die and heat slug assemblies can be transferred (picked-and-placed, fanned-out, etc.) to an adhesive panel or wafer carrier (along with assemblies from other leadframe strips or matrices) for further (fan-out) assembly processing, including compression molding at block 1045.

At block 1050 of the process flow 1000B in FIG. 10B, a grinding operation can then be performed on the molded device 1000 to expose the heat slug 1052 and the Cu wire bumps 1012 of block 1010 through the molding compound of block 1045 (as well as to reduce package thickness). At block 1055, a plating seed layer can be deposited (sputtered) and, at block 1060, photolithography (photomasking and development) can be performed to define the areas to be plated so as to define a final contact pad 1077 layout for the completed packaged semiconductor device 1000.

As shown in FIG. 10C, the process flow 1000B can include performing plating operations (e.g., Cu plating at block 1065 and/or Sn plating at block 1070) to define (plate) the final contact pads over the heat slug 1052 and the Cu wire bumps 1012 (e.g., based on the photolithography pattern of block 1060. At block 1075, remaining photoresist and un-plated seed layer can then be removed. At block 1080, individual packaged semiconductor devices 1000 can be singulated (e.g., saw singulated). At block 1085, testing of the singulated devices on the adhesive panel or wafer carrier of block 1040 can be performed. At block 1090, the devices that pass testing at block 1085 can be picked-and-placed into a tape and reel carrier, or other container for shipping to a circuit board assembly facility.

In a general aspect, a packaged semiconductor device can include a semiconductor die having at least a first terminal on a first side of the semiconductor die and at least a second terminal on a second side of the semiconductor die. The packaged semiconductor device can also include a leadframe portion electrically coupled to the first terminal of the semiconductor die and a clip portion electrically coupled to the second terminal of the semiconductor die. The packaged semiconductor device can also include a molding compound. A surface of the leadframe portion and a first surface of the molding compound can define at least a portion of a first surface of the packaged semiconductor device. A surface of the clip portion and a second surface of the molding compound can define at least a portion of a second surface of the packaged semiconductor device that is parallel to the first surface of the packaged semiconductor device, where the second surface of the packaged semiconductor device is on an opposite side of the packaged semiconductor device from the first surface of the packaged semiconductor device.

Implementations can include one or more of the following features. For example, the leadframe portion can be a first leadframe portion and the packaged semiconductor device further can include a second leadframe portion electrically coupled to a third terminal on the first side of the semiconductor die. The second leadframe portion can have a surface included in the first surface of the packaged semiconductor device. The packaged semiconductor device can include a third leadframe portion electrically coupled with the second terminal of the semiconductor die through the clip portion. The third leadframe portion can have a surface included in the first surface of the packaged semiconductor device.

The clip portion can be a first clip portion and the packaged semiconductor device can include a second clip portion electrically coupled with the first terminal of the semiconductor die via the first leadframe portion. The second clip portion can have a surface included in the second surface of the packaged semiconductor device. The packaged semiconductor device can include a third clip portion electrically coupled with the third terminal of the semiconductor die via the third leadframe portion. The third clip portion can have a surface included in the second surface of the packaged semiconductor device. The packaged semiconductor device can include a first plated portion disposed on the second surface of the packaged semiconductor device, where the first plated portion is electrically coupled with the first clip portion. The packaged semiconductor device can include a second plated portion disposed on the second surface of the packaged semiconductor device, where the second plated portion is electrically coupled with the second clip portion. The packaged semiconductor device can include a third plated portion disposed on the second surface of the packaged semiconductor device, where the third plated portion is electrically coupled with the third clip portion.

The clip portion can be a first clip portion and the packaged semiconductor device can include a second clip portion electrically coupled with the third terminal of the semiconductor die via the second leadframe portion. The second clip portion can have a surface included in the second surface of the packaged semiconductor device.

The first terminal of the semiconductor die can be a source terminal of a field effect transistor (FET) device. The second terminal of the semiconductor die can be a drain terminal of the FET device. The third terminal of the semiconductor die can be a gate terminal of the FET device.

The first terminal of the semiconductor die can be a gate terminal of a field effect transistor (FET) device. The second terminal of the semiconductor die can be a drain terminal of the FET device. The third terminal of the semiconductor die can be a drain terminal of the FET device.

The clip portion can be a first clip portion and the packaged semiconductor device can include a second clip portion electrically coupled with the first terminal of the semiconductor die via the leadframe portion. The second clip portion can have a surface included in the second surface of the packaged semiconductor device.

The packaged semiconductor device can include a laminate layer affixed to the second surface of the packaged semiconductor device. The laminate layer can substantially cover the second surface of the packaged semiconductor device and have an outer surface that is substantially parallel with the second surface of the packaged semiconductor device.

The packaged semiconductor device can include a plated portion disposed on the second surface of the packaged semiconductor device. The plated portion can be electrically coupled with the clip portion. The plated portion can have a surface area on the second surface of the packaged semiconductor device that is different than a surface area of the surface of the clip portion.

The packaged semiconductor device can have a heat slug affixed to the clip portion.

In another general aspect, a packaged semiconductor device can include a semiconductor die having a first terminal on a first side of the semiconductor die, a second terminal on a second side of the semiconductor die and a third terminal on the second side of the die. The packaged semiconductor device can also include a leadframe portion electrically coupled to the first terminal of the semiconductor die and coupled to the first side of the semiconductor die. The packaged semiconductor device can further include a first clip portion electrically coupled to the second terminal of the semiconductor die and coupled to the second side of the semiconductor die. The packaged semiconductor device can still further include a second clip portion electrically coupled to the third terminal of the semiconductor die and coupled to the second side of the die. The packaged semiconductor device can also include a third clip portion electrically coupled to the first terminal of the semiconductor die via the leadframe portion. The packaged semiconductor device can also include a molding compound. A surface of the leadframe portion and a first surface of the molding compound can define at least a portion of a first surface of the packaged semiconductor device. A surface of the first clip portion, a surface of the second clip portion, a surface of the third clip portion and a second surface of the molding compound can define at least a portion of a second surface of the packaged semiconductor device. The second surface of the packaged semiconductor device can be parallel to the first surface of the packaged semiconductor device, the second surface of the packaged semiconductor device being on an opposite side of the packaged semiconductor device from the first surface of the packaged semiconductor device.

Implementations can include one or more of the following features. For example, the first terminal of the semiconductor die can be a drain terminal of a field effect transistor (FET) device. The second terminal of the semiconductor die can be a gate terminal of the FET device. The first terminal of the semiconductor die can be a source terminal of the FET device.

The packaged semiconductor device can include a first plated portion disposed on the second surface of the packaged semiconductor device, where the first plated portion is electrically coupled with the first clip portion. The packaged semiconductor device can include a second plated portion disposed on the second surface of the packaged semiconductor device, where the second plated portion is electrically coupled with the second clip portion. The packaged semiconductor device can include a third plated portion disposed on the second surface of the packaged semiconductor device, where the third plated portion is electrically coupled with the third clip portion.

The first plated portion can have a surface area on the second surface of the packaged semiconductor device that is different than a surface area of the surface of the first clip portion. The second plated portion can have a surface area on the second surface of the packaged semiconductor device that is different than a surface area of the surface of the second clip portion. The third plated portion can have a surface area on the second surface of the packaged semiconductor device that is different than a surface area of the surface of the third clip portion.

In another general aspect, a packaged semiconductor device can include a semiconductor die having a first terminal on a first side of the semiconductor die, a second terminal on a second side of the semiconductor die and a third terminal on the second side of the die. The packaged semiconductor device can also include a clip portion electrically coupled to the first terminal of the semiconductor die and coupled to the first side of the semiconductor die. The packaged semiconductor device can further include a first leadframe portion electrically coupled to the second terminal of the semiconductor die and coupled to the second side of the semiconductor die. The packaged semiconductor device can still further include a second leadframe portion electrically coupled to the third terminal of the semiconductor die and coupled to the second side of the semiconductor die. The packaged semiconductor device can also further include a third leadframe portion electrically coupled to the first terminal of the semiconductor die via the clip portion. The packaged semiconductor device can also include a molding compound. A surface of the clip portion and a first surface of the molding compound can define at least a portion of a first surface of the packaged semiconductor device. A surface of the first leadframe portion, a surface of the second leadframe portion, a surface of the third leadframe portion and a second surface of the molding compound can define at least a portion of a second surface of the packaged semiconductor device. The second surface of the packaged semiconductor device can be parallel to the first surface of the packaged semiconductor device. The second surface of the packaged semiconductor device can be on an opposite side of the packaged semiconductor device from the first surface of the packaged semiconductor device.

Implementations can include one or more of the following features. For example, the first terminal of the semiconductor die can be a drain terminal of a field effect transistor (FET) device. The second terminal of the semiconductor die can be a gate terminal of the FET device. The third terminal of the semiconductor die can be a source terminal of the FET device.

The packaged semiconductor device can include a plated portion disposed on the first surface of the packaged semiconductor device. The plated portion can be electrically coupled with the clip portion. The plated portion can have a surface area on the first surface of the packaged semiconductor device that is different than a surface area of the surface of the clip portion.

It will be understood that, in the foregoing description, when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Implementations of the various techniques described herein may be implemented in (e.g., included in) digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application specific integrated circuit).

Implementations may be implemented in a computing system that includes a back end component, e.g., as a data server, or that includes a middleware component, e.g., an application server, or that includes a front end component, e.g., a client computer having a graphical user interface or a Web browser through which a user can interact with an implementation, or any combination of such back end, middleware, or front end components. Components may be interconnected by any form or medium of digital data communication, e.g., a communication network. Examples of communication networks include a local area network (LAN) and a wide area network (WAN), e.g., the Internet.

Some implementations may be implemented using various semiconductor processing and/or packaging techniques. Some implementations may be implemented using various types of semiconductor processing techniques associated with semiconductor substrates including, but not limited to, for example, Silicon (Si), Galium Arsenide (GaAs), Galium Nitride (GaN), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A packaged semiconductor device comprising:
a semiconductor die having at least a first terminal on a first side of the semiconductor die and at least a second terminal on a second side of the semiconductor die;
a leadframe portion electrically coupled to the first terminal of the semiconductor die;
a first clip portion electrically coupled to the second terminal of the semiconductor die;
a second clip portion electrically coupled with the first terminal of the semiconductor die via the leadframe portion; and
a molding compound, wherein:
  a surface of the leadframe portion and a first surface of the molding compound define at least a portion of a first surface of the packaged semiconductor device, and
  a surface of the first clip portion, a surface of the second clip portion and a second surface of the molding compound define at least a portion of a second surface of the packaged semiconductor device that is parallel to the first surface of the packaged semiconductor device, the second surface of the packaged semiconductor device being on an opposite side of the packaged semiconductor device from the first surface of the packaged semiconductor device.

2. The packaged semiconductor device of claim 1, wherein the leadframe portion is a first leadframe portion, the packaged semiconductor device further comprising a second leadframe portion electrically coupled to a third terminal on the first side of the semiconductor die, the second leadframe portion having a surface included in the first surface of the packaged semiconductor device.

3. The packaged semiconductor device of claim 2, further comprising a third leadframe portion electrically coupled with the second terminal of the semiconductor die through the first clip portion, the third leadframe portion having a surface included in the first surface of the packaged semiconductor device.

4. The packaged semiconductor device of claim 3, further comprising a third clip portion electrically coupled with the third terminal of the semiconductor die via the third leadframe portion, the third clip portion having a surface included in the second surface of the packaged semiconductor device.

5. The packaged semiconductor device of claim 4, further comprising:
a first plated portion disposed on the second surface of the packaged semiconductor device, the first plated portion being electrically coupled with the first clip portion;
a second plated portion disposed on the second surface of the packaged semiconductor device, the second plated portion being electrically coupled with the second clip portion; and
a third plated portion disposed on the second surface of the packaged semiconductor device, the third plated portion being electrically coupled with the third clip portion.

6. The packaged semiconductor device of claim 2, wherein:
the first terminal of the semiconductor die is a source terminal of a field effect transistor (FET) device;
the second terminal of the semiconductor die is a drain terminal of the FET device; and
the third terminal of the semiconductor die is a gate terminal of the FET device.

7. The packaged semiconductor device of claim 2, wherein:
the first terminal of the semiconductor die is a gate terminal of a field effect transistor (FET) device;
the second terminal of the semiconductor die is a drain terminal of the FET device; and
the third terminal of the semiconductor die is a source terminal of the FET device.

8. The packaged semiconductor device of claim 1, further comprising a laminate layer affixed to the second surface of the packaged semiconductor device, the laminate layer substantially covering the second surface of the packaged semiconductor device and having an outer surface that is substantially parallel with the second surface of the packaged semiconductor device.

9. The packaged semiconductor device of claim 1, further comprising a plated portion disposed on the second surface of the packaged semiconductor device, the plated portion being electrically coupled with the first clip portion.

10. The packaged semiconductor device of claim 9, wherein the plated portion has a surface area on the second surface of the packaged semiconductor device that is different than a surface area of the surface of the first clip portion.

11. The packaged semiconductor device of claim 1, further comprising a heat slug affixed to the first clip portion.

12. A packaged semiconductor device comprising:
a semiconductor die having:
a first terminal on a first side of the semiconductor die;
a second terminal on a second side of the semiconductor die; and
a third terminal on the second side of the semiconductor die;
a leadframe portion electrically coupled to the first terminal of the semiconductor die and coupled to the first side of the semiconductor die;
a first clip portion electrically coupled to the second terminal of the semiconductor die and coupled to the second side of the semiconductor die;
a second clip portion electrically coupled to the third terminal of the semiconductor die and coupled to the second side of the semiconductor die; and
a molding compound, wherein:
a surface of the leadframe portion and a first surface of the molding compound defines at least a portion of a first surface of the packaged semiconductor device, and
a surface of the first clip portion, a surface of the second clip portion and a second surface of the molding compound define at least a portion of a second surface of the packaged semiconductor device, the second surface of the packaged semiconductor device being parallel to the first surface of the packaged semiconductor device, the second surface of the packaged semiconductor device being on an opposite side of the packaged semiconductor device from the first surface of the packaged semiconductor device.

13. The packaged semiconductor device of claim 12, wherein:
the first terminal of the semiconductor die is a drain terminal of a field effect transistor (FET) device;
the second terminal of the semiconductor die is a gate terminal of the FET device; and
the first terminal of the semiconductor die is a source terminal of the FET device.

14. The packaged semiconductor device of claim 12, further comprising a third clip portion electrically coupled to the first terminal of the semiconductor die via the leadframe portion, a surface of the third clip portion being included in the second surface of the packaged semiconductor device.

15. The packaged semiconductor device of claim 14, further comprising:
a first plated portion disposed on the second surface of the packaged semiconductor device, the first plated portion being electrically coupled with the first clip portion;
a second plated portion disposed on the second surface of the packaged semiconductor device, the second plated portion being electrically coupled with the second clip portion; and
a third plated portion disposed on the second surface of the packaged semiconductor device, the third plated portion being electrically coupled with the third clip portion.

16. The packaged semiconductor device of claim 15, wherein:
the first plated portion has a surface area on the second surface of the packaged semiconductor device that is different than a surface area of the surface of the first clip portion;
the second plated portion has a surface area on the second surface of the packaged semiconductor device that is different than a surface area of the surface of the second clip portion; and
the third plated portion has a surface area on the second surface of the packaged semiconductor device that is different than a surface area of the surface of the third clip portion.

17. A packaged semiconductor device comprising:
a semiconductor die having:
a first terminal on a first side of the semiconductor die;
a second terminal on a second side of the semiconductor die; and
a third terminal on the second side of the die;
a clip portion electrically coupled to the first terminal of the semiconductor die and coupled to the first side of the semiconductor die;
a first leadframe portion electrically coupled to the second terminal of the semiconductor die and coupled to the second side of the semiconductor die;
a second leadframe portion electrically coupled to the third terminal of the semiconductor die and coupled to the second side of the semiconductor die; and
a molding compound, wherein:
a surface of the clip portion and a first surface of the molding compound define at least a portion of a first surface of the packaged semiconductor device, and
a surface of the first leadframe portion, a surface of the second leadframe portion and a second surface of the molding compound define at least a portion of a second surface of the packaged semiconductor device, the second surface of the packaged semiconductor device being parallel to the first surface of the packaged semiconductor device, the second surface of the packaged semiconductor device being on an opposite side of the packaged semiconductor device from the first surface of the packaged semiconductor device,
the packaged semiconductor device further comprising a plated portion disposed on the first surface of the packaged semiconductor device, the plated portion being electrically coupled with the clip portion.

18. The packaged semiconductor device of claim 17, wherein:
the first terminal of the semiconductor die is a drain terminal of a field effect transistor (FET) device;
the second terminal of the semiconductor die is a gate terminal of the FET device; and
the third terminal of the semiconductor die is a source terminal of the FET device.

19. The packaged semiconductor device of claim 17, further comprising a third leadframe portion electrically coupled to the first terminal of the semiconductor die via the clip portion, a surface of the third leadframe portion being included in the second surface of the packaged semiconductor device.

20. The packaged semiconductor device of claim 17, wherein the plated portion has a surface area on the first surface of the packaged semiconductor device that is different than a surface area of the surface of the clip portion.

21. The packaged semiconductor device of claim 17, wherein the clip portion is a first clip portion, the packaged semiconductor device further comprising:
- a second clip portion electrically coupled to the second terminal of the semiconductor die and coupled to the second side of the semiconductor die, a surface of the second clip portion being included in the first surface of the packaged semiconductor device; and
- a third clip portion electrically coupled to the third terminal of the semiconductor die and coupled to the second side of the semiconductor die, a surface of the third clip portion being including in the first surface of the packaged semiconductor device.

\* \* \* \* \*